(12) United States Patent  
Hirabayashi et al.

(10) Patent No.: US 7,064,630 B2  
(45) Date of Patent: Jun. 20, 2006

(54) HIGH-FREQUENCY MODULE AND ITS MANUFACTURING METHOD

(75) Inventors: Takayuki Hirabayashi, Tokyo (JP); Takahiko Kosemura, Kanagawa (JP); Akihiko Okubora, Kanagawa (JP); Tatsuya Ogino, Kanagawa (JP); Kuniyuki Hayashi, Oita (JP)

(73) Assignee: Sony Corporation, Tokyo (JP)

( * ) Notice: Subject to any disclaimer, the term of this patent is extended or adjusted under 35 U.S.C. 154(b) by 179 days.

(21) Appl. No.: 10/312,248

(22) PCT Filed: Apr. 25, 2002

(86) PCT No.: PCT/JP02/04178

§ 371 (c)(1),  
(2), (4) Date: Dec. 23, 2002

(87) PCT Pub. No.: WO02/089209

PCT Pub. Date: Nov. 7, 2002

(65) Prior Publication Data  
US 2003/0151477 A1 Aug. 14, 2003

(30) Foreign Application Priority Data  
Apr. 26, 2001 (JP) .............................. 2001-130191

(51) Int. Cl.  
*H01P 1/20* (2006.01)

(52) U.S. Cl. ...................................... 333/204; 333/133

(58) Field of Classification Search ................ 333/204, 333/133  
See application file for complete search history.

(56) References Cited

U.S. PATENT DOCUMENTS

| 5,717,249 A | 2/1998 | Yoshikawa |
| 5,929,510 A * | 7/1999 | Geller et al. ................. 257/635 |
| 6,057,600 A * | 5/2000 | Kitazawa et al. ........... 257/728 |
| 6,456,172 B1 * | 9/2002 | Ishizaki et al. ............. 333/133 |
| 6,797,890 B1 * | 9/2004 | Okubora et al. ............ 174/260 |

FOREIGN PATENT DOCUMENTS

| JP | 05-63408 | 3/1993 |
| JP | 08-335836 | 12/1996 |
| JP | 2001-102511 | 4/2001 |

* cited by examiner

*Primary Examiner*—Robert Pascal  
*Assistant Examiner*—Kimberly Glenn  
(74) *Attorney, Agent, or Firm*—Sonnenschein, Nath & Rosenthal LLP

(57) ABSTRACT

The present invention provides a high-frequency module device having a distributed constant circuit formed therein, the device comprising: a base board (2) having a high-frequency element layer forming surface (3) formed by performing flattening processing on an uppermost layer of a multilayer printed wiring part in which a printed wiring layer having a ground part and a dielectric insulating layer made of a dielectric insulating material are formed in a multilayer form on one major surface of a core board (6); and a high-frequency element layer part (5) having a passive element and a circuit element for receiving power or a signal supplied from the base board (2) via a dielectric insulating part made of a dielectric insulating material, on the high-frequency element layer forming surface (3) of the base board (2). The base board (2) has a distributed constant circuit (4) formed by pattern wiring.

6 Claims, 18 Drawing Sheets

HIGH-FREQUENCY MODULE AND ITS MANUFACTURING METHOD

TECHNICAL FIELD

This invention relates to a high-frequency module device and a manufacturing method thereof. More particularly, this invention relates to a high-frequency module device which constitutes a micro-communication function module provided in a personal computer, a portable telephone unit, an audio equipment or the like and having an information communication function, a storage function and the like, and a manufacturing method thereof.

BACKGROUND ART

As digital data are broadly used, various information including, for example, music, sounds and images, can be easily handled by a personal computer, a mobile computer and the like. A technique is being developed, which enables band compression of such information by an audio codec technique or a video codec technique and easy and efficient distribution of the band-compressed information to various communication terminal equipments through digital communication or digital broadcasts. For example, audio/video data (AV data) can be received outdoors by a portable telephone unit.

A transmission/reception systems for data and the like is used for various purposes, since network systems preferred at home and in a small area are proposed. Such network systems include various types of next-generation wireless systems, for example, a narrow-range radio communication system with a 5-GHz band as proposed in IEEE802.11a, a radio LAN system with a 2.45-GHz band as proposed in IEEE802.11b, and a short-range radio communication system called Bluetooth.

Using such wireless network systems effectively, the transmission/reception system can easily send/receive various data, access the Internet, and send/receive data on the Internet, in various places including home and outdoors without using a repeating installation.

In the transmission/reception system for data and the like, a communication terminal equipment which is small-sized, lightweight and portable and which has the above-described communication function must be realized. In the communication terminal equipment, modulation and demodulation of analog high-frequency signals need be carried out in a transmitting/receiving unit. Therefore, generally, a high-frequency transmitting/receiving circuit 100 based on a superheterodyne system for converting transmitting/receiving signals to an intermediate frequency, as shown in FIG. 1, is provided.

The high-frequency transmitting/receiving circuit 100 has an antenna part 101 having an antenna and a switch and adapted for receiving or transmitting information signals, and a transmission/reception switching unit 102 for switching transmission and reception. The high-frequency transmitting/receiving circuit 100 also has a receiving circuit part 105 made up of a frequency conversion circuit part 103, a demodulation circuit part 104 and the like. The high-frequency transmitting/receiving circuit 100 also has a transmitting circuit part 109 made up of a power amplifier 106, a drive amplifier 107, a modulation circuit part 108 and the like. Moreover, the high-frequency transmitting/receiving circuit 100 has a reference frequency generation circuit part for supplying a reference frequency to the receiving circuit part 105 and the transmitting circuit part 109.

Although not described in detail, the high-frequency transmitting/receiving circuit 100 constituted as described above has a large number of large-size functional components such as various filters, local oscillators (VCO) and SAW filters inserted between respective stages, and a large number of passive components such as inductors, resistors and capacitors which are proper to a high-frequency analog circuit such as a matching circuit or a bias circuit. Therefore, the high-frequency transmitting/receiving circuit 100 is large-sized as a whole and becomes an obstacle to reduction in size and weight of the communication terminal equipment.

Meanwhile, in the terminal communication equipment, a high-frequency transmitting/receiving circuit 110 based on a direct conversion system for sending and receiving information signals without performing conversion to an intermediate frequency, as shown in FIG. 2, is also used. In the high-frequency transmitting/receiving circuit 110, an information signal received by an antenna part 111 is supplied to a demodulation circuit part 113 via a transmission/reception switching unit 112 and base band processing is directly performed thereon. In the high-frequency transmitting/receiving circuit 110, an information signal generated at a source is directly modulated to a predetermined frequency band without being converted to an intermediate frequency at a modulation circuit part 114, and is then sent from the antenna part 111 via an amplifier 115 and the transmission/reception switching unit 112.

Since the high-frequency transmitting/receiving circuit 110 constituted as described above has the structure in which direct detection of an information signal is performed to send and receive the information signal without converting the information to an intermediate frequency, the number of components such as filters is reduced and the entire structure is simplified. Thus, a structure closer to one chip can be realized. However, in the high-frequency transmitting/receiving circuit 110 shown in FIG. 2, handling by a filter or a matching circuit arranged on the subsequent stage is necessary. In the high-frequency transmitting/receiving circuit 110, since amplification is carried out once on the high-frequency stage, it is difficult to realize a sufficient gain and amplification must be carried out also at a base band part. Therefore, the high-frequency transmitting/receiving circuit 110 needs a DC offset cancellation circuit and a sufficient low-pass filter. This further increases the power consumption of the whole circuit.

The conventional high-frequency transmitting/receiving circuit, whether it is based on the superheterodyne system or the direct conversion system as described above, cannot realize satisfactory characteristics to meet the requirement of reduction in size and weight of the communication terminal equipment. Therefore, various attempts have been made to constitute a module in which miniaturization is realized by using a simple structure based on, for example, a Si-CMOS circuit. Specifically, one approach is to form a passive element having good characteristics on a Si substrate, prepare a filter circuit, a resonator and the like on an LSI, and also integrate a logic LSI of a base band part, thus producing a so-called one-chip high-frequency module.

In this one-chip high-frequency module, how to form a high-performance inductor part 120 on an LSI is extremely important, as shown in FIGS. 3A and 3B. In such a one-chip high-frequency module, a large recess part 124 is formed corresponding to an inductor part forming part 123 in a Si substrate 121 and a $SiO_2$ insulating layer 122. In the one-chip high-frequency module, a first wiring layer 125 exposed to the recess part 124 is formed and a second wiring layer 126 closing the recess part 124 is formed, thus constituting a coil part 127. In the one-chip high-frequency module, a part of the wiring pattern is raised up in the air from the substrate surface, corresponding to the other parts, thus forming the inductor part 120. For this one-chip high-frequency module, the step of forming the inductor part 120 is very complicated and the increased number of steps raises the cost.

The one-chip high-frequency module has a problem of large electrical interference of a Si substrate provided between a high-frequency circuit part of an analog circuit and a base band circuit part of a digital circuit.

As high-frequency modules which solve the foregoing problem, for example, a high-frequency module 130 using a Si substrate as a base board shown in FIG. 4 and a high-frequency module 140 using a glass substrate as a base board shown in FIG. 5 are proposed.

In the high-frequency module 130 shown in FIG. 4, a $SiO_2$ layer 132 is formed on a Si substrate 131 and then a passive element forming layer 133 is formed thereon by a lithography technique. Although not described in detail, a wiring pattern and passive elements such as inductor parts, resistor parts or capacitor parts are formed in a multilayer form within the passive element forming layer 133 by a thin film forming technique or a thick film forming technique. In the high-frequency module 130, terminal parts connected with the internal wiring pattern through via-holes (junction through-holes) are formed on the passive element forming layer 133, and a circuit element 134 such as a high-frequency IC or LSI is directly mounted on these terminal parts by a flip-chip mounting method or the like. By mounting this high-frequency module 130, for example, on a mother board or the like, the high-frequency part and the base band circuit part are separated from each other and electrical interference between these part can be restrained. In such a high-frequency module 130, the conductive Si substrate 131 functions when forming each passive element within the passing element forming layer 133 but has a problem of hindrance to the good high-frequency characteristic of each passive element.

On the other hand, the high-frequency module 140 shown in FIG. 5 uses a glass substrate 141 as a base board in order to solve the problem of the Si substrate 131 in the above-described high-frequency module 130. Also in the high-frequency module 140, a passive element forming layer 142 is formed on the glass substrate 141 by a lithography technique. Although not described in detail, a wiring pattern and passive elements such as inductor parts, resistor parts or capacitor parts are formed in a multilayer form within the passive element forming layer 142 by a thin film forming technique or a thick film forming technique.

In the high-frequency module 140 shown in FIG. 5, terminal parts connected with the internal wiring pattern through via-holes are formed on the passive element forming layer 142, and a circuit element 143 such as a high-frequency IC or LSI is directly mounted on these terminal parts by a flip-chip mounting method or the like. Since this high-frequency module 140 uses the glass substrate 141, which is not electrically conductive, the capacitive coupling between the glass substrate 141 and the passive element forming layer 142 is restrained and passive elements having good a high-frequency characteristic can be formed within the passive element forming layer 142.

To mount the high-frequency module 140 shown in FIG. 5, for example, on a mother board or the like, a terminal pattern is formed on the surface of the passive element forming layer 142 and connection with the mother board is carried out by using a wiring bonding method or the like. The high-frequency module 140 requires a terminal pattern forming step and a wiring bonding step.

In these one-chip high-frequency modules, the passive element forming layers with high precision are formed on the base boards, as described above. In the thin film forming of the passive element forming layer, the base board requires heat resistance to a rise in surface temperature at the time of sputtering, maintenance of the depth of focus at the time of lithography, and contact alignment at the time of masking. The base board needs flatness with high accuracy, insulation property, heat resistance or chemical resistance.

The above-described Si substrate 131 and glass substrate 141 have such characteristics and enable formation of passive elements with little loss and at a low cost by a separate process from the LSI. The Si substrate 131 and the glass substrate 141 enable formation of passive elements with higher precision, compared with a pattern forming method based on printing or a wet etching method for forming a wiring pattern on a printed wiring board, used in the conventional ceramic module technique. Moreover, the Si substrate 131 and the glass substrate 141 enable reduction in area of the elements to approximately $\frac{1}{100}$.

In these high-frequency modules, for a carrier frequency just above 5 GHz, a circuit design based on a distributed constant circuit using, for example, a transmission line coupling line stub, can realize higher performance than a circuit design based on concentrated constant elements using circuit components such as inductor parts and resistor parts. In these high-frequency modules, for higher frequencies, a design based on a distributed constant circuit is essential to the functional elements such as a band-pass filter, and the use of the concentrated constant elements such as inductor parts and resistor parts is limited to choke and decoupling.

However, in a high-frequency module 150 shown in FIG. 6, a distributed constant circuit can be formed only in one layer, that is, a passive element forming layer 151 on one major surface of the Si substrate 131 or the glass substrate 141. For example, if a band-pass filter 152 or the like is formed as a distributed constant circuit, the occupied area of the band-pass filter 152 increases. Moreover, in the high-frequency module 150, a predetermined spacing indicated by an arrow Y in FIG. 6 must be provided between the band-pass filter 152 and a mounted circuit element 153 such as a high-frequency IC or LSI, in order to avoid electrical interference. This also increases the area. The high-frequency module 150 also has a problem of increased cost due to the use of the relatively expensive Si substrate 131 or glass substrate 141.

DISCLOSURE OF THE INVENTION

In view of the foregoing status of the art, it is an object of the present invention to provide a high-frequency module device which has a multilayer printed wiring part having a distributed constant circuit formed therein and which realizes reduction in area and size and reduction in electrical interference by passive elements and circuit elements, and a manufacturing method thereof.

In order to achieve the foregoing object, a high-frequency module device according to the present invention comprises: a base board having a high-frequency element layer forming surface formed by performing flattening processing on an uppermost layer a multilayer printed wiring part in which a printed wiring layer having a ground part and a dielectric insulating layer made of a dielectric insulating material are formed in a multilayer form on one major surface of a core board; and a high-frequency element part having a passive element and a circuit element for receiving power or a signal supplied from the base board via a dielectric insulating part made of a dielectric insulating material, on the high-frequency element layer forming surface of the base board; the base board having a distributed constant circuit formed by pattern wiring.

In the high-frequency module device according to the present invention, since the base board having the multilayer printed wiring part has the distributed constant circuit, the distributed constant circuit is formed as it is embedded in the base board, and the area for forming the distributed constant circuit in the base board is reduced. Moreover, since the ground part of the printed wiring layer serves as a shield, electrical interference of the passive element and the circuit element formed on the high-frequency element layer forming surface is restrained.

In order to achieve the foregoing object, a method for manufacturing a high-frequency module device according to the present invention comprises: a base board preparation process for preparing a base board through a first step of forming a first insulating layer on one major surface of a core board via a first printed wiring layer having a ground part, a second step of forming a distributed constant circuit made of pattern wiring on the first insulating layer, a third step of forming a second printed wiring layer on a second insulating layer covering the distributed constant circuit, thus forming a multilayer printed wiring part, and a fourth step of performing flattening processing on an uppermost layer of the multilayer printed wiring part, thus forming a high-frequency element layer forming surface; and a high-frequency element layer forming process for forming a high-frequency element layer through a fifth step of forming a passive element for receiving power or a signal supplied from the base board via a dielectric insulating part made of a dielectric insulating material, on the high-frequency element layer forming surface of the base board, and a sixth step of joining a circuit element for receiving power or a signal supplied from the base board via the dielectric insulating part.

In the method for manufacturing a high-frequency module device according to the present invention, the distributed constant circuit formed by the second step is formed as it is embedded in the base board having the multilayer printed wiring part. Thus, the method of the present invention enable manufacture of a high-frequency module device in which the area for forming the distributed constant circuit in the base board is reduced and in which electrical interference of the passive element and the circuit element formed on the high-frequency element layer forming surface is restrained by shielding the ground part of the printed wiring layer.

The other objects of the present invention and specific advantages provided by the present invention will be further clarified by the following description of embodiments with reference to the drawings.

BEST MODE FOR CARRYING OUT THE INVENTION

Embodiments of the present invention will now be described in detail with reference to the drawings.

Figure 1:
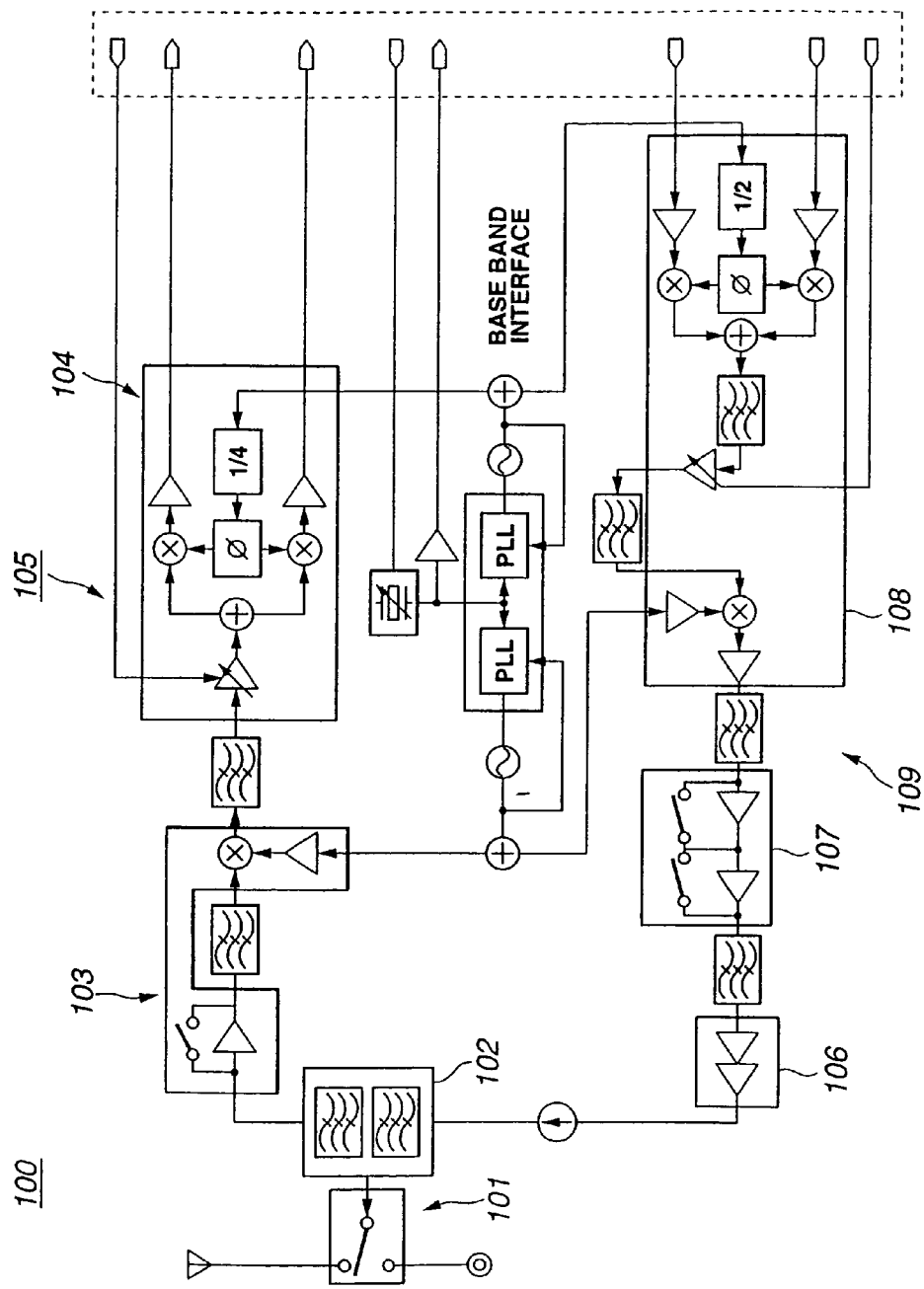
FIG. 1 is a block diagram showing a high-frequency transmitting/receiving circuit based on a superheterodyne system.
Figure 2:
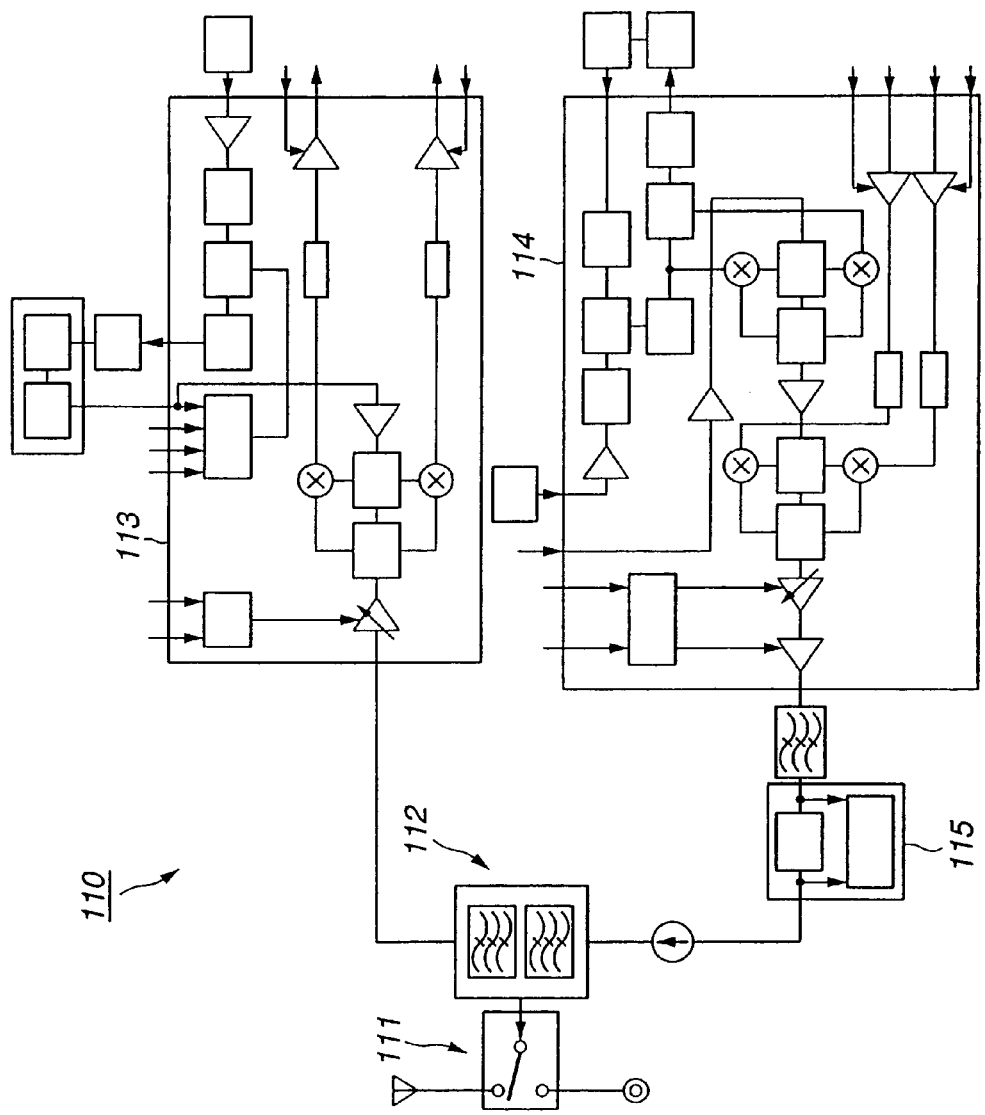
FIG. 2 is a block diagram showing a high-frequency transmitting/receiving circuit based on a direct conversion system.
Figure 3A:
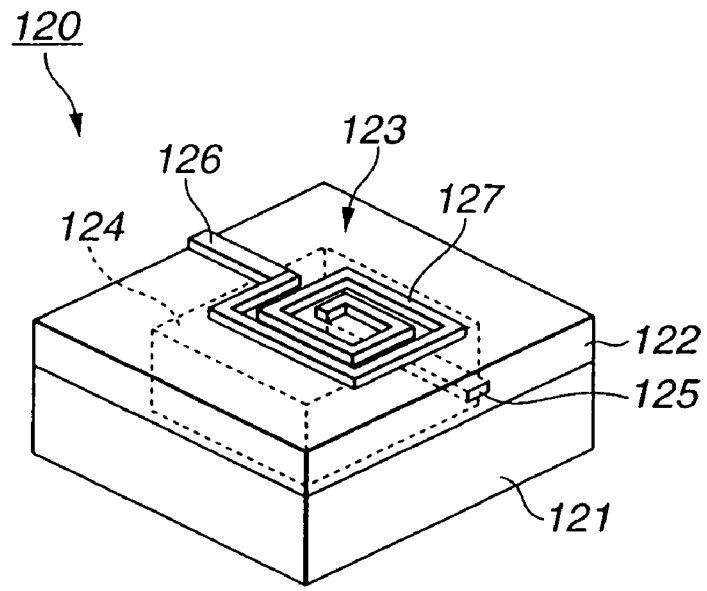
FIG. 3A is a perspective view showing essential parts of an inductor part provided in a conventional high-frequency module.
Figure 3B:
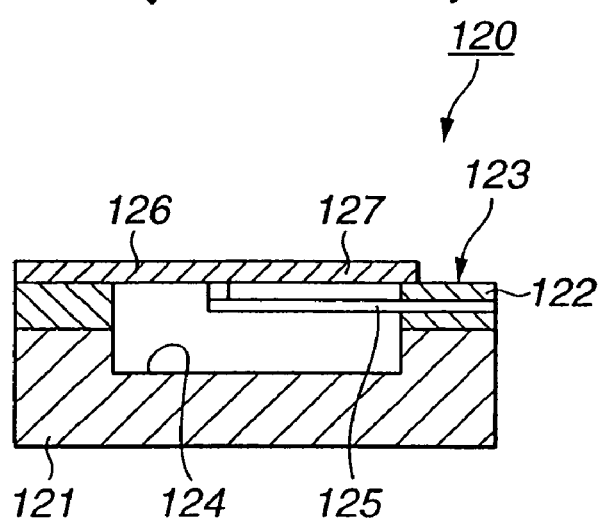
FIG. 3B is a longitudinal sectional view thereof.
Figure 4:
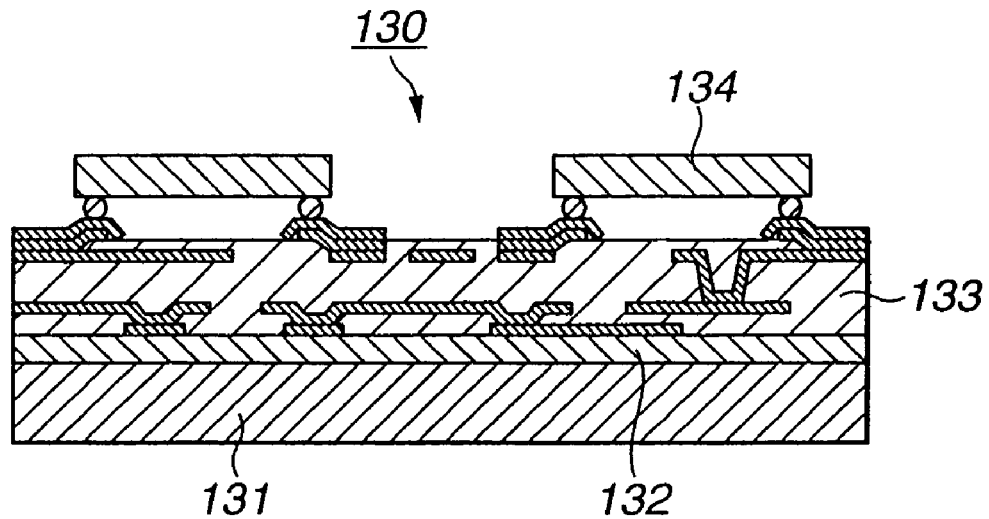
FIG. 4 is a longitudinal sectional view showing a conventional high-frequency module using a silicon substrate.
Figure 5:
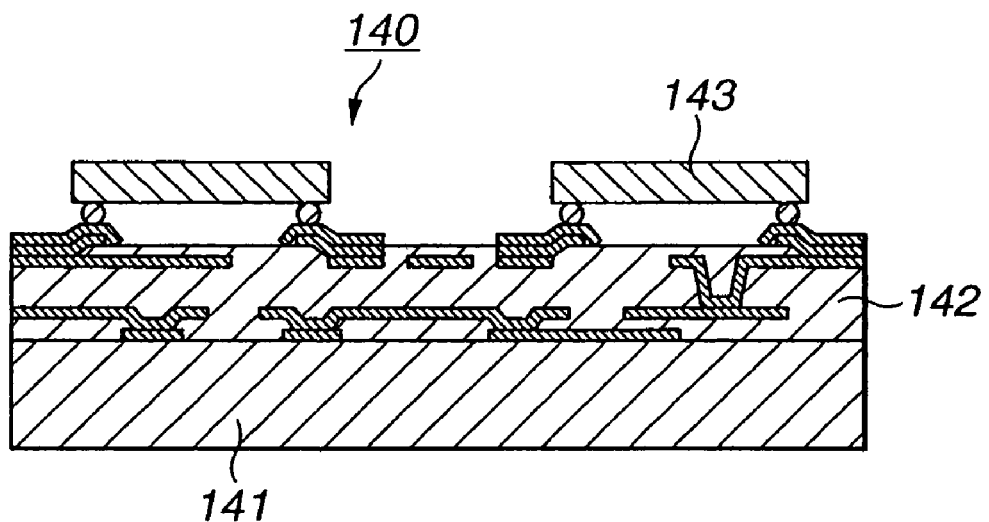
FIG. 5 is a longitudinal sectional view showing a conventional high-frequency module using a glass substrate.
Figure 6:
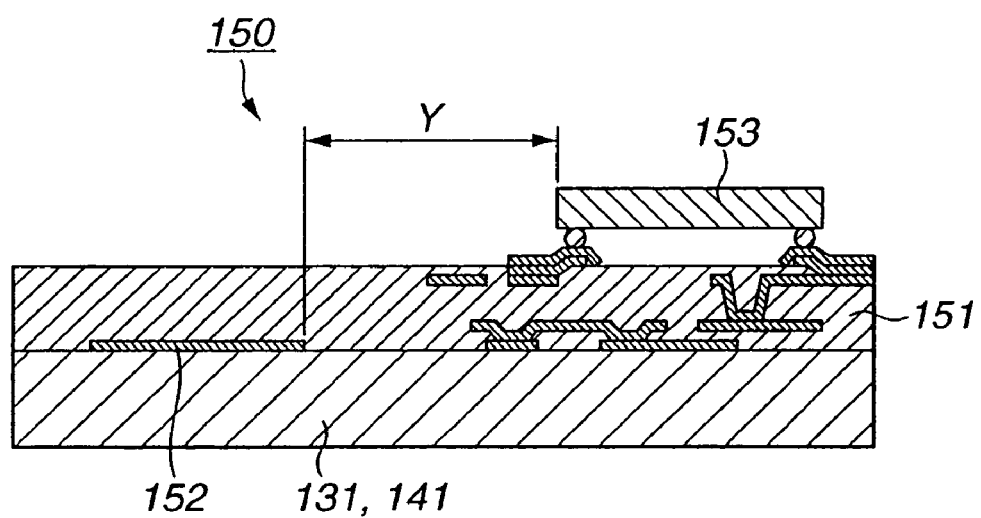
FIG. 6 is a longitudinal sectional view showing the relation between a conventional distributed constant circuit and circuit element.
Figure 7:
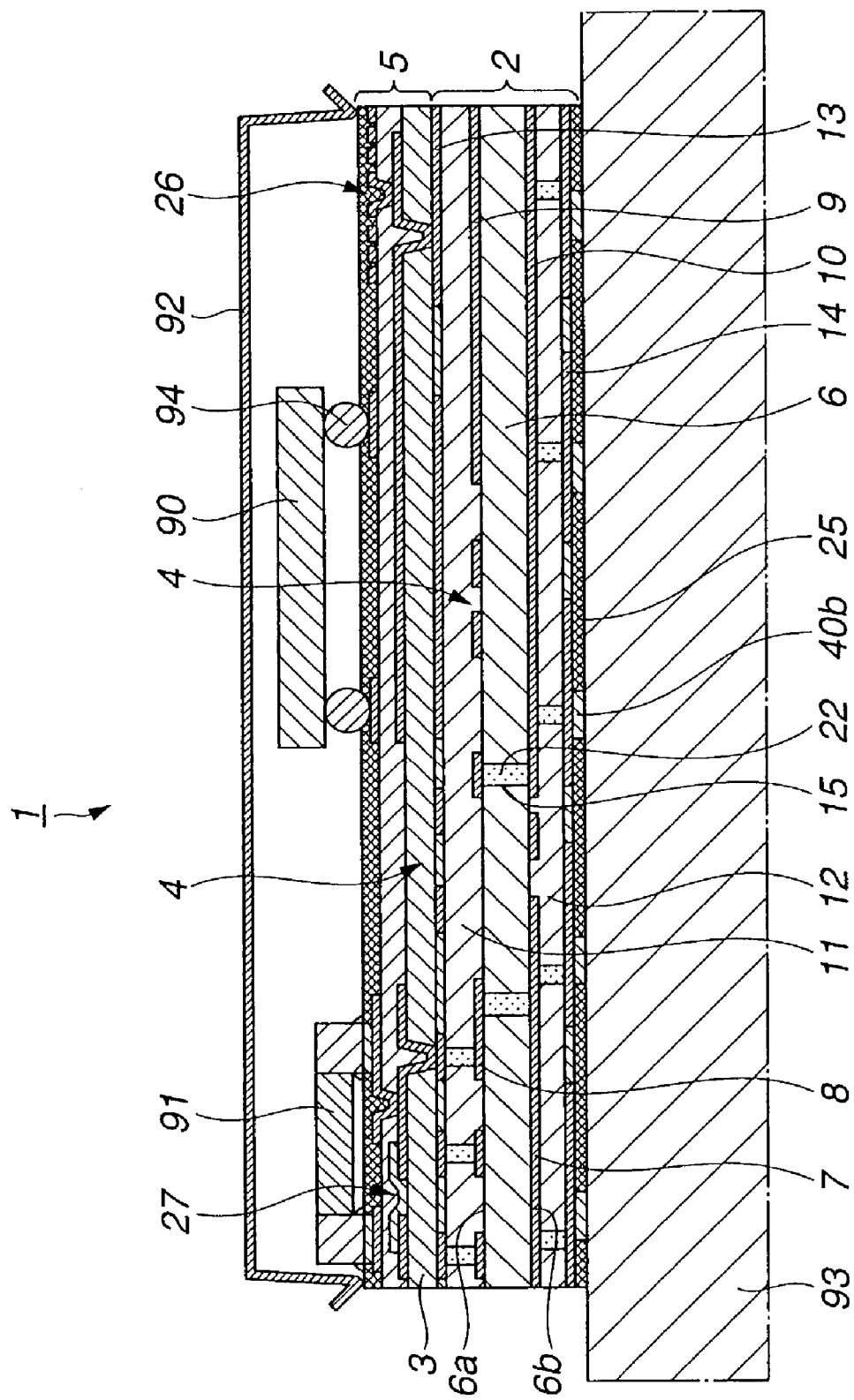
FIG. 7 is a longitudinal sectional view showing a high-frequency module device according to the present invention.

In a high-frequency module device 1 shown in FIG. 7 to which the present invention is applied, an uppermost layer of a base board part 2 formed by a base board part producing process, which will be described later in detail, is constituted as a high-frequency element layer forming surface 3 with a flat surface, and distributed constant circuits 4 such as a filter circuit part 21 and an antenna circuit part 24 are formed in the base board part 2. In this high-frequency module device 1, a high-frequency element layer part 5 is formed on the high-frequency element layer forming surface 3 of the base board part 2 by a high-frequency element layer part producing process, which will be described later. In the high-frequency module device 1, the base board part 2 constitutes a wiring part of a power system and a wiring part or a ground part of a control system with respect to the high-frequency element layer part 5 formed thereon. In the high-frequency module device 1, as shown in FIG. 7, a high-frequency IC 90 and a chip component 91 are mounted on the upper surface of the high-frequency element layer part 5 and sealed by a shield cover 92. The high-frequency module device 1 is mounted as a so-called one-chip component on a mother board 93.

The base board part 2 is constituted by a core board 6 made of a double-sided board, a first pattern wiring layer 9 having the distributed constant circuits 4 provided therein by performing pattern wiring on a copper foil layer 7 formed on the side of a first major surface 6a of the core board 6 as a core, and a second pattern wiring layer 10 formed by performing pattern wiring on a copper foil layer 8 formed on the side of a second major surface 6b. In the base board part 2, a first resin-attached copper foil 11 and a second resin-attached copper foil 12 are joined to the core board 6. The first resin-attached copper foil 11 is joined to the side of the first major surface 6a of the core board 6. By performing pattern wiring on a copper foil layer 11a of the first resin-attached copper foil 11, a third pattern wiring layer 13 having the distributed constant circuits 4 is formed. The second resin-attached copper foil 12 is joined to the side of the second major surface 6b of the core board 6. By performing pattern wiring on a copper foil layer 12a of the second resin-attached copper foil 12, a fourth pattern wiring layer 14 is formed.

The structure of and the production process for the base board part 2 will be described with reference to FIGS. 8 to 16.

Figure 8:
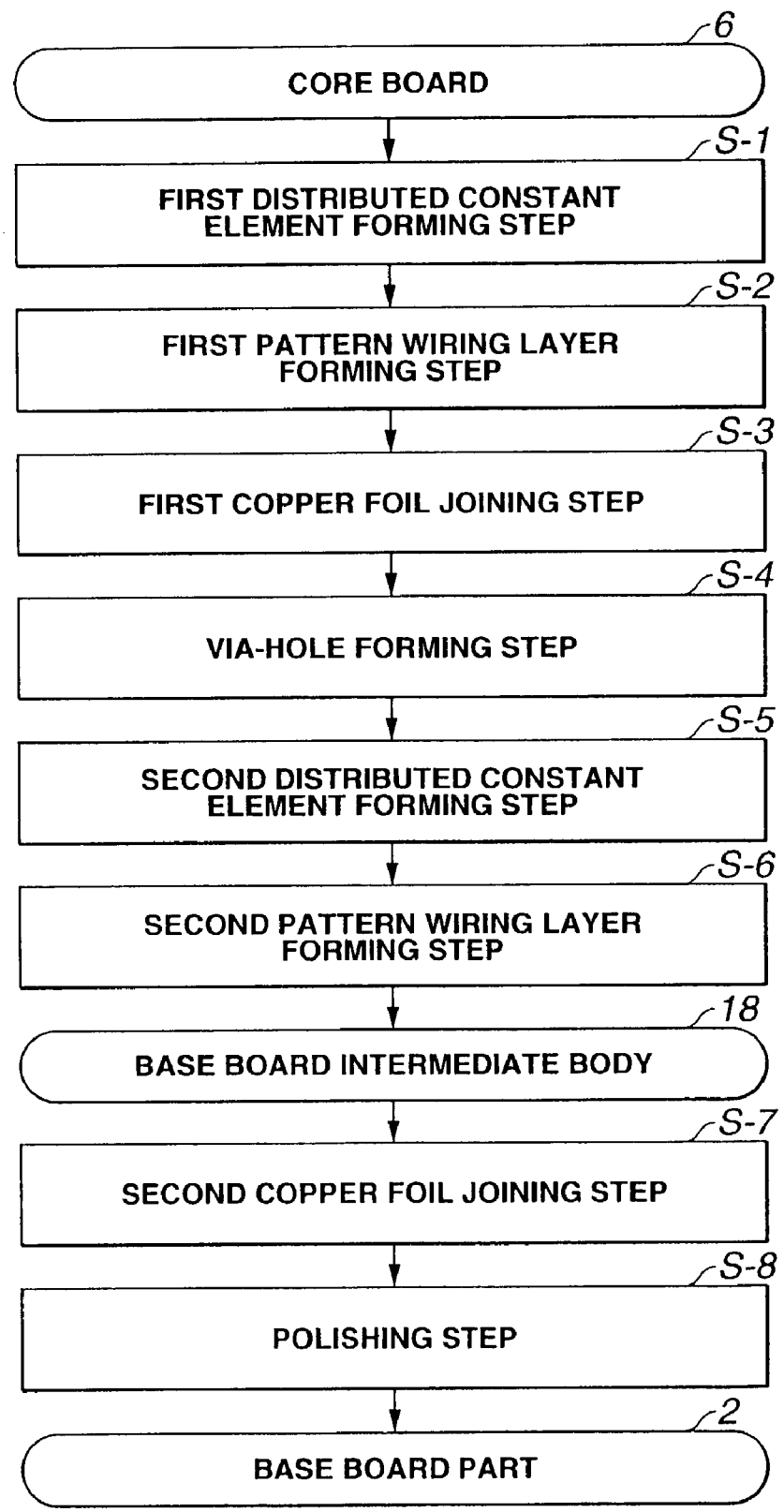
FIG. 8 is a flowchart showing a base board part producing process in the high-frequency module device.

As shown in FIG. 8, the production process for the base board part 2 includes the following steps: a first distributed constant circuit forming step S-1 of forming the distributed constant circuits 4 in the copper foil layer 7 formed on the first major surface 6a of the core board 6; a first pattern wiring layer forming step S-2 of forming a plurality of via-holes 15 penetrating the first pattern wiring layer 9, the second pattern wiring layer 10 and the core board 6, appropriately in both major surfaces 6a, 6b of the core board 6; a first copper foil joining step S-3 of joining the first resin-attached copper foil 11 and the second resin-attached copper foil 12 to the major surfaces 6a, 6b of the core board 6, respectively; and a via-hole forming step S-4 of forming via-holes 16, 17 in these resin-attached copper foils 11, 12. In the production process for the base board part 2, a base board intermediate body 18 is produced by the following steps: a second distributed constant circuit forming step S-5 of forming the distributed constant circuits 4 in the copper foil layer 11a of the first resin-attached copper foil 11 on the side of the major surface 6a of the core board 6; and a second pattern wiring layer forming step S-6 of forming the third pattern wiring layer 13 and the fourth pattern wiring layer 14 appropriately in the resin-attached copper foils 11, 12 joined to the core board 6.

The production process for the base board part 2 also includes a second copper foil joining step S-7 of joining to the base board intermediate body 18 a third resin-attached copper foil 19 and a fourth resin-attached copper foil 20 which cover the third pattern wiring layer 13 and the fourth pattern wiring layer 14, respectively. The production process for the base board part 2 also includes a polishing step S-8 of performing polishing on the third resin-attached copper foil 19 and the fourth resin-attached copper foil 20 to form the high-frequency element layer forming surface 3 on the uppermost layer on the side of the first major surface 6a of the core board 6, thus producing the base board part 2.

The core board 6 is made of a material having a small dielectric constant and small Tanδ, that is, a material having an excellent high-frequency characteristic, for example, polyphenylene ether (PPE), bismaleidtriazine (BT-resin), polytetrafluoroethylene (Teflon (trademark)), polyimide, liquid crystal polymer (LCP), polynorbornene (PNB), ceramics, or a mixture of ceramics and an organic base material. The core board 6 may also be made of, for example, an epoxy-based board FR-5 or the like, which has mechanical rigidity, heat resistance and chemical resistance and is less expensive than the foregoing materials. As the core board 6 is made of the above-described materials, it is formed with high accuracy and less expensively than a Si substrate and a glass substrate, which are relatively expensive. Thus, reduction in material cost is realized.

Figure 9:
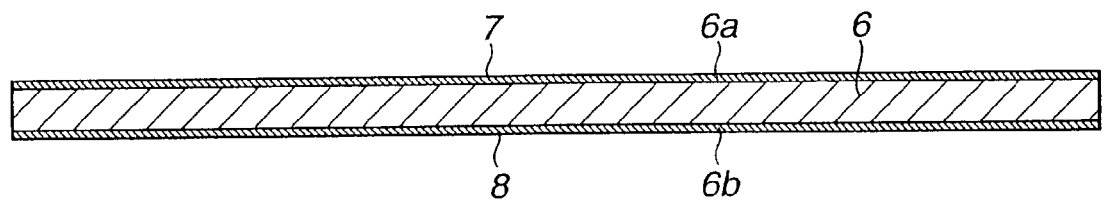
FIG. 9 is a longitudinal sectional view showing a core board used in the high-frequency module device.
Figure 10:
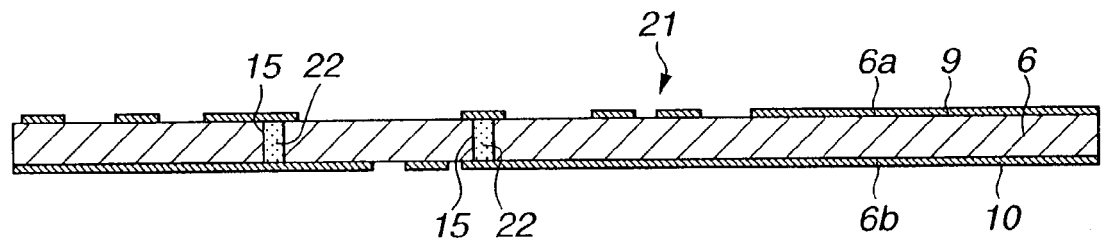
FIG. 10 is a sectional view showing a step of forming a first distributed constant circuit.

As shown in FIG. 9, the copper foil layers 7, 8 are formed on the entire first major surfaces 6a and the entire second major surface 6b of the core board 6, respectively. As shown in FIG. 10, the first distributed constant circuit forming step S-1 is performed on the core board 6. As photolithography processing or the like is performed on the copper foil layer 7 of the core board 6, the filter circuit part 21 as the distributed constant circuit 4 is formed at a predetermined position on the first major surface 6a.

The first pattern wiring layer forming step S-2 is performed on the core board 6. Boring processing is performed on the core board 6, thus forming the via-holes 15 at predetermined positions. In the via-holes 15 of the core board 6 in which conduction processing is performed on their inner walls by plating or the like, conductive paste 22 is embedded and then a cover is formed by plating. As photolithography processing is performed on the copper foil layers 7, 8 of the core board 6, the first pattern wiring layer 9 and the second pattern wiring layer 10 are formed at predetermined positions on the first major surface 6a and the second major surface 6b, respectively.

Figure 11:
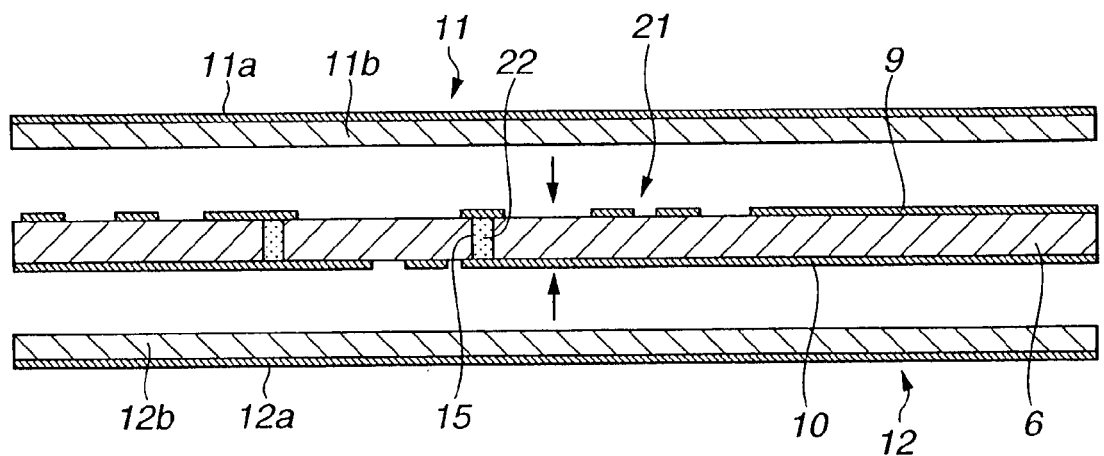
FIG. 11 is a sectional view showing a step of joining a first resin-attached copper foil and a second resin-attached copper foil.

In the core board 6 after the foregoing steps, the first resin-attached copper foil 11 and the second resin-attached copper foil 12 covering the first pattern wiring layer 9 and the second pattern wiring layer 10, respectively, are joined to the first major surface 6a and the second major surface 6b by the first copper foil joining step S-3, as shown in FIG. 11. As the first resin-attached copper foil 11 and the second resin-attached copper foil 12, so-called resin-attached copper foils formed by lining an entire major surface of the copper foil layer 11a and an entire major surface of the copper foil layer 12a with resin layers 11b, 12b are used.

The first resin-attached copper foil 11 and the second resin-attached copper foil 12 are joined to the first major surface 6a and the second major surface 6b of the core board 6 by an adhesive resin (prepreg), using the sides of the resin layers 11b, 12b as junction surfaces. If the resin layers 11b, 12b are made of a thermoplastic resin, the first resin-attached copper foil 11 and the second resin-attached copper foil 12 are joined to the core board 6, requiring no adhesive resin.

Figure 12:
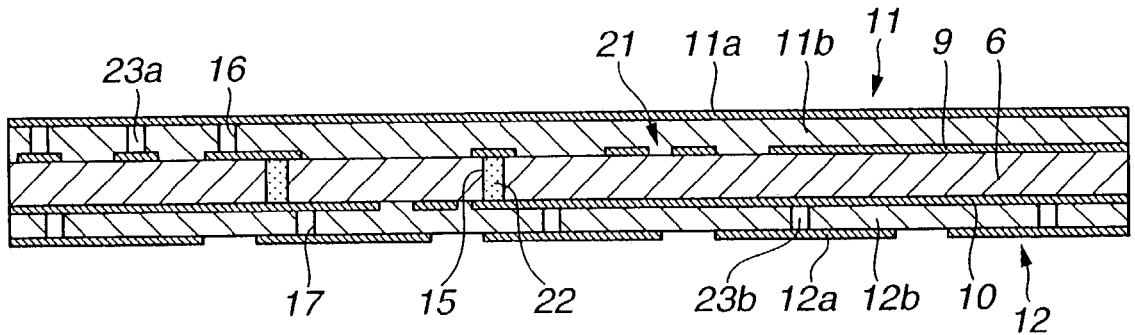
FIG. 12 is a sectional view showing a step of forming a via-hole.

On the first resin-attached copper foil 11 and the second resin-attached copper foil 12 which are joined with the core board 6, the via-hole forming step S-4 is performed and the via-holes 16, 17 are formed by performing photolithography processing on the parts corresponding to the above-described via-holes 15, as shown in FIG. 12. In the via-hole forming step S-4, photolithography processing is performed on the parts where the via-holes 16, 17 are to be formed, and then wet etching is carried out to form apertures 23a, 23b in the first resin-attached copper foil 11 and the second resin-attached copper foil 12. Using these apertures 23a, 23b as masks, laser processing is performed to form the via-holes 16, 17 received by land parts of the first pattern wiring layer 9 and the second pattern wiring layer 10.

Figure 13:
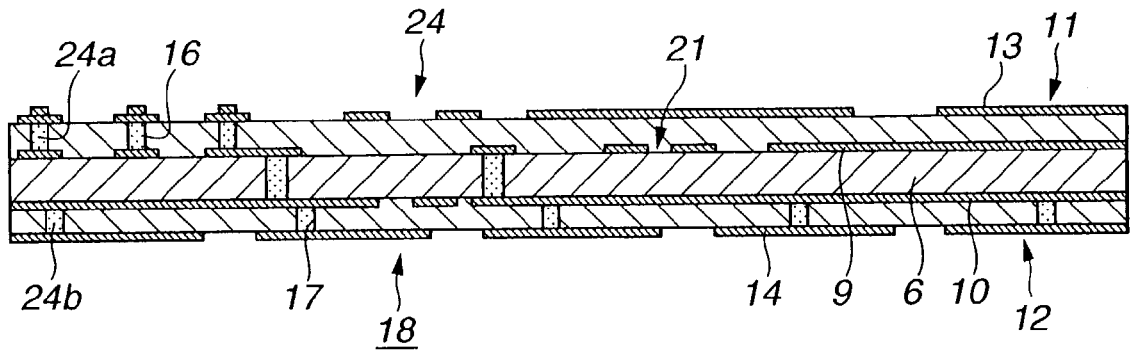
FIG. 13 is a sectional view showing a step of forming a second distributed

The second distributed constant circuit forming step S-5 is performed on the first resin-attached copper foil 11, as shown in FIG. 13. As photolithography processing or the like is performed on the copper foil layer 11a of the first resin-attached copper foil 11, the antenna circuit part 24 as the distributed constant circuit 4 is formed at a predetermined position in the copper foil layer 11a. In the first resin-attached copper foil 11 and the second resin-attached copper foil 12, as shown in FIG. 13, conduction processing is performed on the inner walls of the via-holes 16, 17 by via-plating or the like and conductive materials 24a, 24b are filled therein by plating or embedding conductive paste.

By the second pattern wiring layer forming step S-6, predetermined patterning is performed on the copper foil layers 11a, 12a, thus forming the third pattern wiring layer 13 and the fourth pattern wiring layer 14 on the first resin attached copper foil 11 and the second resin-attached copper foil 12. In the second pattern wiring layer forming step S-6, similar to the above-described first pattern wiring layer forming step S-2, photolithography processing is performed on the copper foil layers 11a, 12a to form the third pattern wiring layer 13 and the fourth pattern wiring layer 14 on the resin layers 11b, 12b, respectively, thus producing the base board intermediate body 18.

Figure 14:
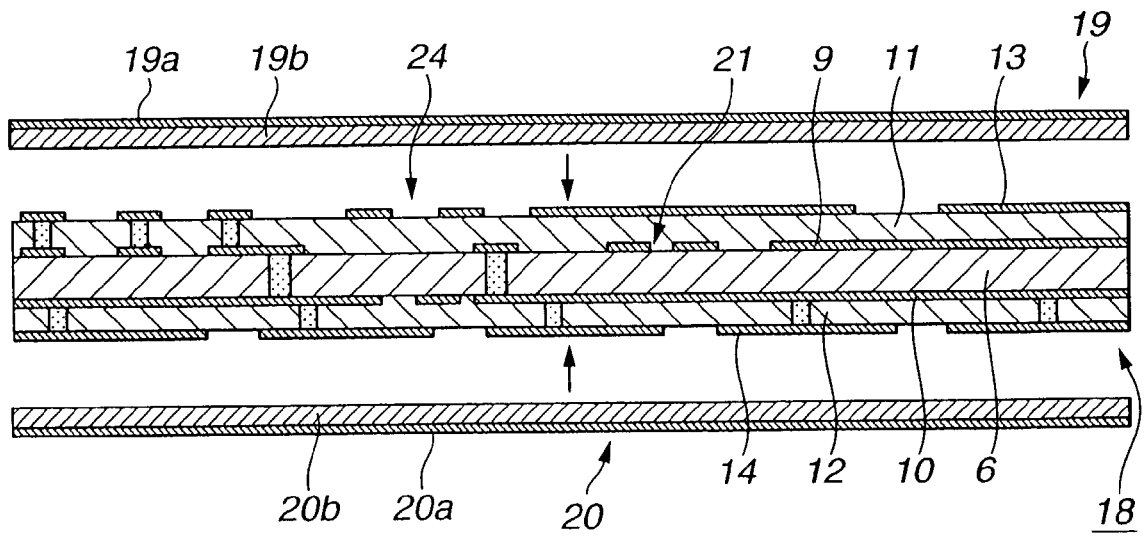
FIG. 14 is a sectional view showing a step of joining a third resin-attached copper foil and a fourth resin-attached copper foil.

In the base board part producing process, a polishing step for forming the high-frequency element layer forming surface 3 with highly accurate flatness is performed on the base board intermediate body 18, in order to form the high-frequency element layer part 4, which will be described later, on the base board part 2. By the second copper foil joining step S-7, the third resin-attached copper foil 19 and the fourth resin-attached copper foil 20 are joined to the base board intermediate body 18 so as to cover the third pattern wiring layer 13 and the fourth pattern wiring layer 14, respectively, as shown in FIG. 14. As the third resin-attached copper foil 19 and the fourth resin-attached copper foil 20, so-called resin-attached copper foils formed by lining an entire major surface of a copper foil layer 19a and an entire major surface of a copper foil layer 20a with resin layers 19b, 20b are used, similarly to the above-described first resin-attached copper foil 11 and second resin-attached copper foil 12.

Figure 15:
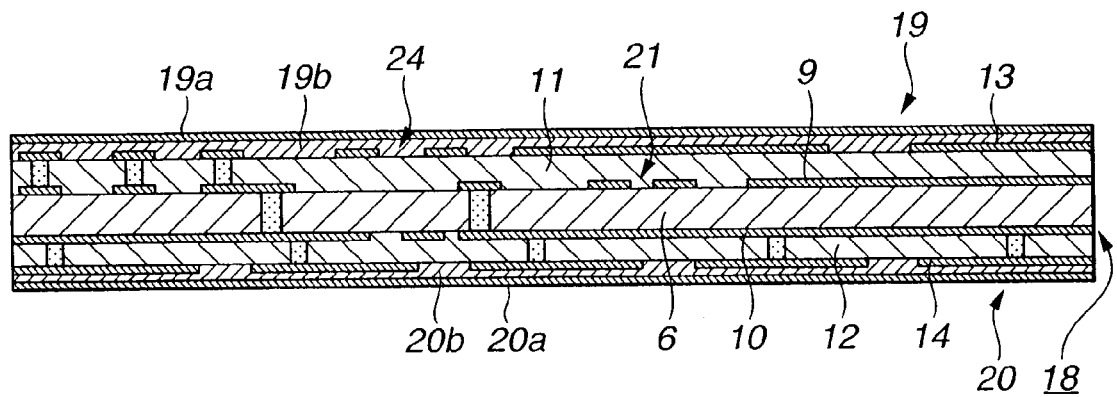
FIG. 15 is a sectional view showing a step in the state where the third resin-attached copper foil and the fourth resin-attached copper foil are joined.

The third resin-attached copper foil 19 and the fourth resin-attached copper foil 20 are joined to both major surfaces of the base board intermediate body 18 by an adhesive resin (prepreg), using the resin layers 19b, 20b as junction surfaces, as shown in FIG. 15. Again, if the resin layers 19b, 20b are made of a thermoplastic resin, the third resin-attached copper foil 19 and the fourth resin-attached copper foil 20 are joined to the base board intermediate body 18, requiring no adhesive resin.

Figure 16:
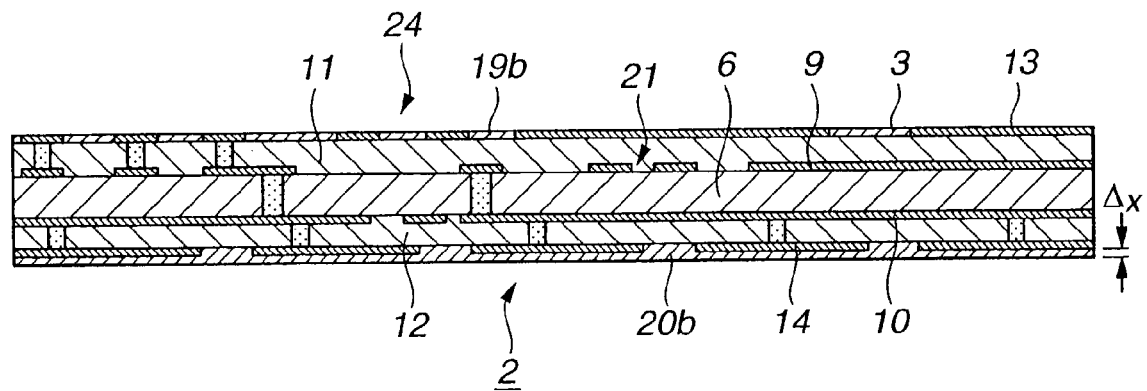
FIG. 16 is a sectional view showing a step of polishing the third resin-attached copper foil and the fourth resin-attached copper foil.
Figure 17:
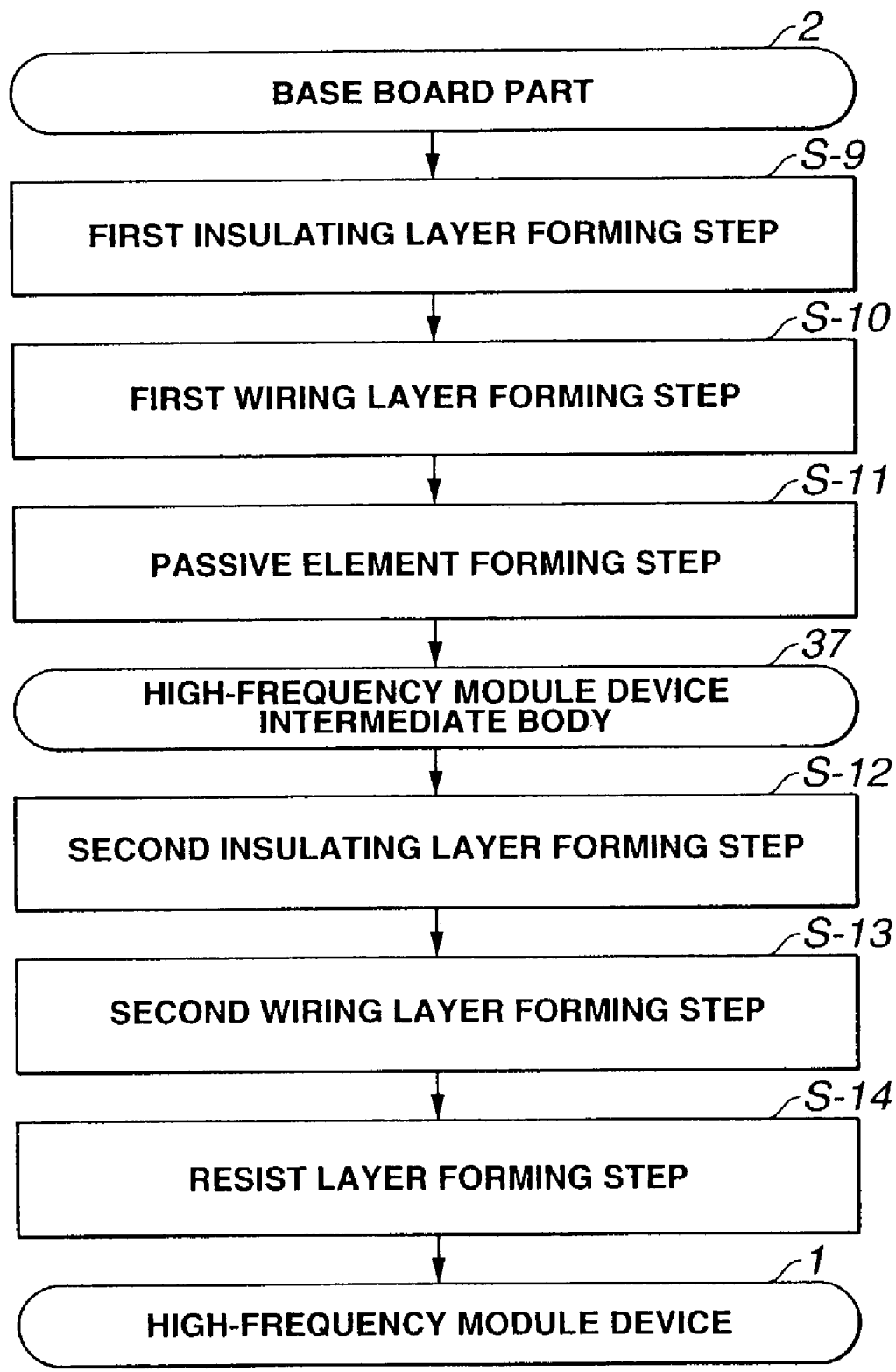
FIG. 17 is a flowchart showing a high-frequency element layer part producing process in the high-frequency module device.

In the polishing step S-8, polishing processing is performed on the third resin-attached copper foil 19 and the fourth resin-attached copper foil 20 joined with the base board intermediate body 18. In the polishing step S-8, the entire third resin-attached copper foil 19 and the entire fourth resin-attached copper foil 20 are polished with a polisher made of, for example, a mixed solution of alumina and silica, thus forming highly accurate flat surfaces on both sides of the base board intermediate body 18. In the polishing step S-8, on the side of the third resin-attached copper foil 19, that is, on the side of the high-frequency element layer forming surface 3, polishing is performed until the third pattern wiring layer 13 is exposed, as shown in FIG. 16. In the polishing step S-8, on the side of the fourth resin-attached copper foil 20, polishing is performed without exposing the fourth pattern wiring layer 14, leaving a predetermined thickness $\Delta x$ of the resin layer 20b.

In the base board part producing process, the base board part 2 on which the high-frequency element layer forming surface 3 with high flatness accuracy is formed is produced on the basis of the core board 6 and the base board intermediate body 18 by the above-described steps. In the base board part producing process, since the step of producing the base board intermediate body 18 is similar to a conventional multilayer board producing step, the multilayer board producing process can be used as it is and high productivity is realized. However, the base board part producing process is not limited to the above-described process and various conventional multilayer board producing processes may be used.

In the base board part 2, the first resin-attached copper foil 11 joined to the side of the first major surface 6a of the core board 6 forms the third pattern wiring layer 13, as described above. In the base board part 2, the third pattern wiring layer 13 has such a structure that the resin layer 19b of the third resin-attached copper foil 19 is polished until the third pattern wiring layer 13 is exposed. In the base board part 2, as the high-frequency element layer part 5 is formed on the third pattern wiring layer 13 by the high-frequency element layer part producing process, which will be described later, the resin layer 19b for protecting the third pattern wiring layer 13 from chemicals and mechanical or thermal load is no longer necessary. In the base board part 2 with such a structure, the third pattern wiring layer 13 constitutes the wiring part of the power system and the wiring part or ground part of the control system with respect to the high-frequency element layer part 5 in the high-frequency element layer part producing process, which will be described later.

In the base board part 2, the second resin-attached copper foil 12 joined to the side of the second major surface 6b of the core board 6 forms the fourth pattern wiring layer 14, as described above. In the base board part 2, the fourth pattern wiring layer 14 has such a structure that the fourth pattern wiring layer 14 is not exposed as the polishing quantity of the resin layer 20b of the fourth resin-attached copper foil 20 is limited. In the base board part 2, because of such a structure, the remaining resin layer 20b (dielectric layer) protects the fourth pattern wiring layer 14 from chemicals and mechanical or thermal load in the high-frequency element layer part producing process, which will be described later. As the above-described resin layer 20*b* is sliced and removed after the high-frequency element layer part 5 is formed, the fourth pattern wiring layer 14 is exposed and forms an input/output terminal part 25.

In the base board part 2 produced as described above, the high-frequency element layer part 5 is stacked on the high-frequency element layer forming surface 3 by the high-frequency element layer part forming process, which will be described layer. In the high-frequency element layer part 5, an element forming layer part 28 in which passive elements such as an inductor 26 and a capacitor 27 formed by using a thin film forming technique or a thick film forming technique are provided, and a wiring layer part 29 are formed on the flattened high-frequency element layer forming surface 3 of the base board part 2. In the high-frequency element layer part 5, the high-frequency IC 90 and the chip component 91 are mounted on the wiring layer part 29 and the whole part is covered with the shield cover 92.

In the base board part producing process, the copper foil layer 20*a* of the fourth resin-attached copper foil 20 joined to the base board part 2 via the second resin-attached copper foil 12 is polished. In the base board part producing process, the joined constituent members are pressed and integrated by a pressing machine. In the base board part producing process, since a metallic pressing surface and the fourth resin-attached copper foil 20 fit each other well, accurate pressing is carried out. Therefore, as the copper foil layer 20*a* of the fourth resin-attached copper foil 20 does not constitute a wiring layer, the fourth resin-attached copper foil 20 may be another resin-attached metal foil instead of copper-cladding.

The structure of and the production process for the high-frequency element layer part 5 will now be described in detail with reference to FIGS. 17 to 23.

The production process for the high-frequency element layer part 5 includes the following steps: a first insulating layer forming step S-9 of depositing a first insulating layer 30 on the flattened high-frequency element layer forming surface 3 of the base board part 2 produced by the above-described process; a first wiring layer forming step S-10 of forming a first wiring layer 31 on the first insulating layer 30; and a passive element forming step S-11 of forming each passive element in the element forming layer part 28. The production process for the high-frequency element layer part 5 also includes the following steps: a second insulating layer forming step S-12 of depositing a second insulating layer 32 for covering the element forming layer part 28 and for forming the wiring layer part 29; a second wiring layer forming step S-13 of forming a second wiring layer 33 having a predetermined wiring pattern and passive elements in the wiring layer part 29; and a resist layer forming step S-14 of forming resist layers 34*a*, 34*b* covering both major surfaces. Thus, the high-frequency module device 1 is produced.

In the base board part 2, in the first insulating layer forming step S-9, an insulating dielectric material is supplied onto the high-frequency element layer forming surface 3, thus depositing the first insulating layer 30. As the insulating dielectric material, a material having a small dielectric constant and small Tan δ, that is, a material having an excellent high-frequency characteristic, heat resistance and chemical resistance is used, similarly to the core board 6. Specifically, the insulating dielectric material is benzocyclobutene (BCB), polyimide, polynorbornene (PNB), liquid crystal polymer (LCP), epoxy resin or acrylic resin. The depositing method may be a spin coat method, a curtain coat method, a roll coat method or a dip coat method which maintains coating uniformity and thickness controllability.

Figure 18:
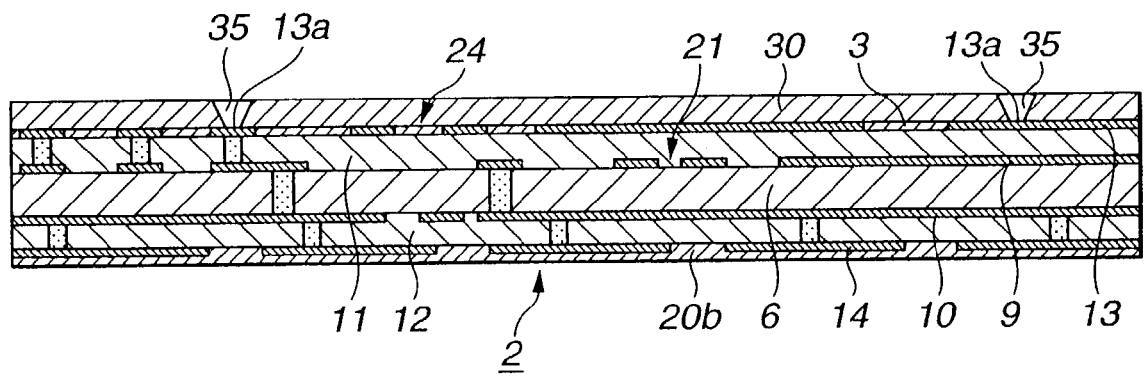
FIG. 18 is a sectional view showing a step of forming a first wiring layer.

In the first insulating layer forming step S-9, many via-holes 35 are formed in the first insulating layer 30 deposited on the base board part 2, as shown in FIG. 18. Each via-hole 35 corresponds to a predetermined land 13*a* of the third wiring layer 13 exposed to the high-frequency element layer forming surface 3 and exposes the land 13*a* to outside. If a photoresistive resin is used as the insulating dielectric material, each via-hole 35 is formed by a photolithography method, with a mask formed in a predetermined pattern and attached to the first insulating layer 30. Each via-hole 35 may also be formed by other appropriate methods.

In the first wiring layer forming step S-10, the first wiring layer 31 made of, for example, a nickel layer and a copper layer, is deposited on the entire surface of the first insulating layer 30 including each via-hole 35, for example, by a sputtering method. The first wiring layer 31 is deposited with each of the nickel layer and the copper layer having a thickness of approximately 50 to 500 nm.

Figure 19:
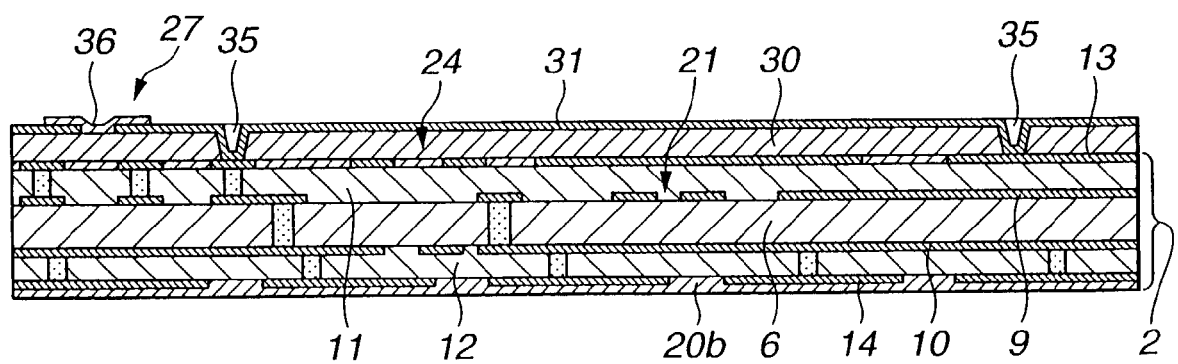
FIG. 19 is a sectional view showing a step of forming an element forming layer part.
Figure 20:
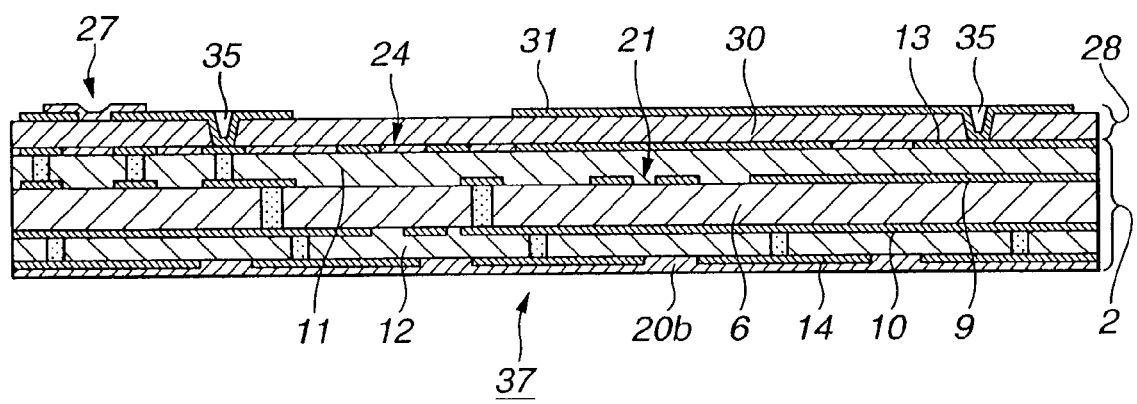
FIG. 20 is a sectional view showing a step of forming a positive element.

The passive element forming step S-11 is performed on the first wiring layer 31, thus forming the capacitor 27, as shown in FIG. 19. At a part on the first wiring layer 31 where the capacitor 27 is to be formed, a tantalum nitride layer 36 is formed. As shown in FIG. 20, resist patterning is performed on the first wiring layer 31 by photolithography processing to leave only a necessary wiring pattern. In the high-frequency element layer part producing process, a high-frequency module device intermediate body 37 having the element forming layer part 28 formed on the base board part 2 is produced by the foregoing steps.

Figure 21:
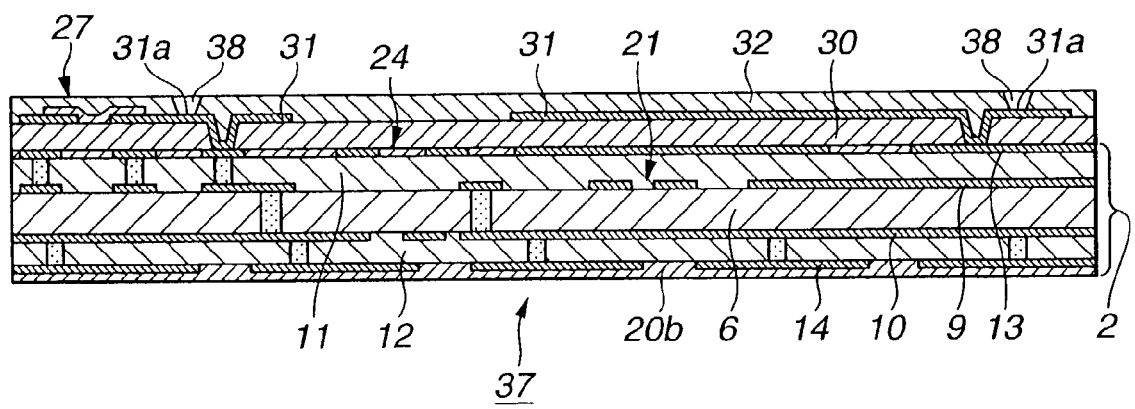
FIG. 21 is a sectional view showing a step of forming a second dielectric insulating layer.

In the high-frequency element layer part producing process, the second insulating layer 32 is deposited on the high-frequency module device intermediate body 37 produced by the foregoing steps, as shown in FIG. 21, by the second insulating layer forming step S-12. In the second insulating layer forming step S-12, the second insulating layer 32 is formed by a method similar to the method for forming the first insulating layer 30, and a plurality of via-holes 38 are formed in the second insulating layer 32 for exposing, to outside, the lands 31*a* joined with the predetermined pattern and the capacitor 27 formed on the first wiring layer 31.

Figure 22:
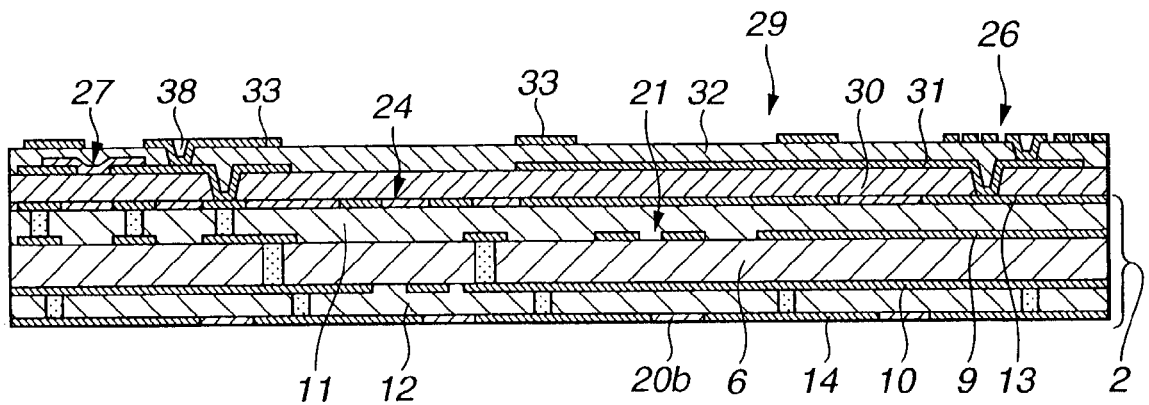
FIG. 22 is a sectional view showing a step of forming a second wiring layer.

In the high-frequency element layer part producing process, the second wiring layer 33 is formed on the second insulating layer 32 by the second wiring layer forming step S-13. Specifically, in the second wiring layer forming step S-13, a sputtering layer made up of a nickel layer and a copper layer is deposited on the second insulating layer 32 by a sputtering method or the like, and photolithography processing is performed on this sputtering layer, thus carrying out predetermined patterning. Moreover, in the second wiring layer forming step S-13, after copper-plating with a thickness of approximately several μm is selectively carried out on the sputtering layer by electroplating, the resist for plating is removed and the entire sputtering layer is etched to form the wiring layer part 29, as shown in FIG. 22.

In this case, the inductor 26 is formed in a part of the wiring layer part 29. Although the inductor 26 has a problem in series resistance value, the inductor 26 is formed with a sufficient thickness by using a thick film forming technique in which electroplating is performed on the sputtering layer as described above and therefore reduction in loss is restrained.

In the high-frequency element layer part producing process, polishing processing is performed on the resin layer 20*b* exposed on the side of the second major surface 6*b* of the core board 6 of the base board part 2, thus exposing the fourth pattern wiring layer 14.

Figure 23:
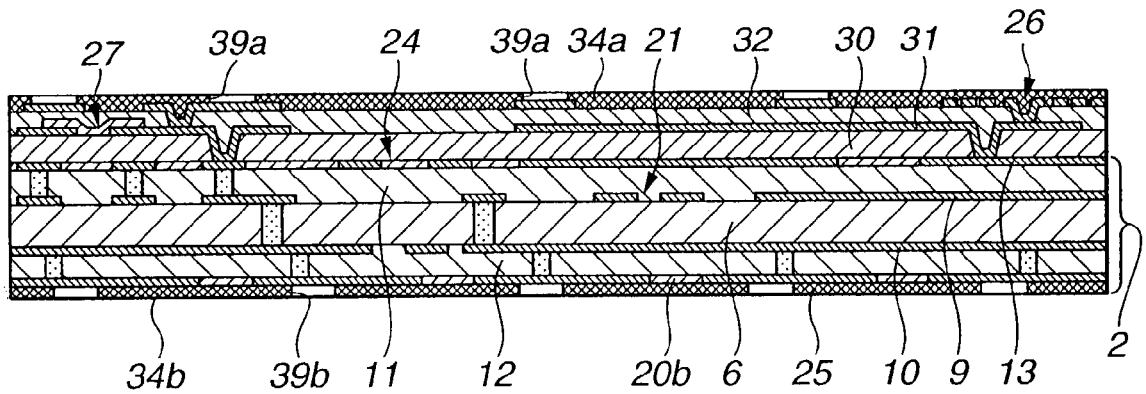
FIG. 23 is a sectional view showing a step of forming a resist layer.
Figure 24:
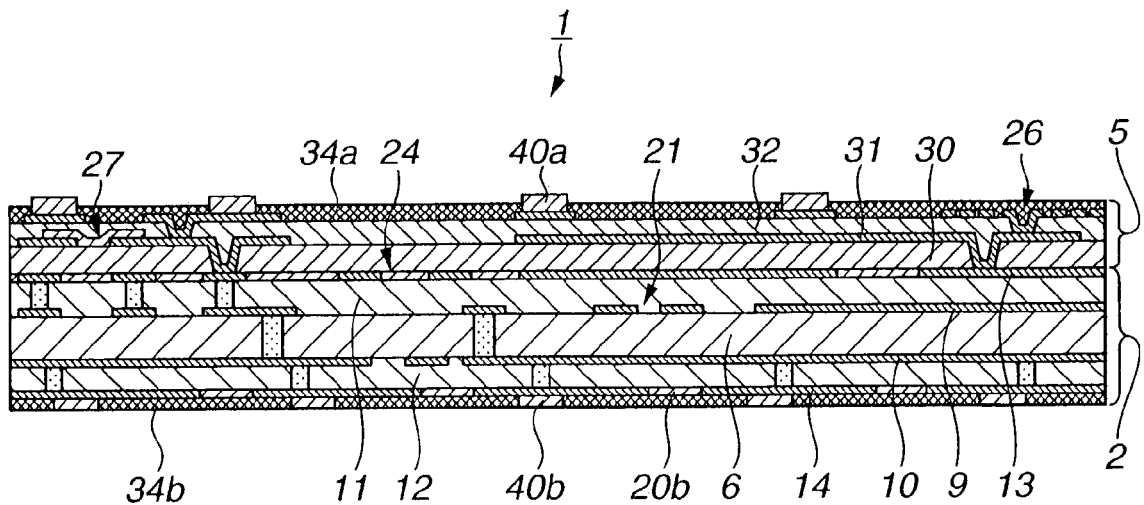
FIG. 24 is a longitudinal sectional view showing another example of the high-frequency module device according to the present invention.

In the high-frequency element layer part producing process, the entire surface of the high-frequency element layer part 5, the fourth pattern wiring layer 14 of the base board part 2, and the permanent resist layers 34*a*, 34*b* are coated by the resist layer forming step S-14. In the high-frequency element layer part producing process, photolithography processing is performed on these resist layers 34*a*, 34*b* with mask patterns thereon, thus forming at predetermined positions an aperture 39*a* through which a land 33*a* is exposed and an aperture 39*b* through which the fourth pattern wiring layer 14 is exposed, as shown in FIG. 23. In the high-frequency element layer part producing process, electroless nickel/copper-plating is performed on these apertures 39*a*, 39*b* to form electrode terminals 40*a*, 40*b*. Thus, the high-frequency module device 1 shown in FIG. 24 is produced.

In the high-frequency module device 1, the electrode terminal 40*a* formed on the side of the high-frequency element layer part 5 constitutes a connection terminal for mounting and connecting the high-frequency IC 90 and the chip component 91, as shown in FIG. 7. In the high-frequency module device 1, the electrode terminal 40*b* formed on the side of the fourth pattern wiring layer 14 of the base board part 2 constitutes a connection terminal and the input/output terminal part 25 when the high-frequency module device 1 is mounted, for example, on the mother board 93. The high-frequency IC 90 is mounted, for example, by a flip-chip mounting method using a flip chip 94.

Figure 25:
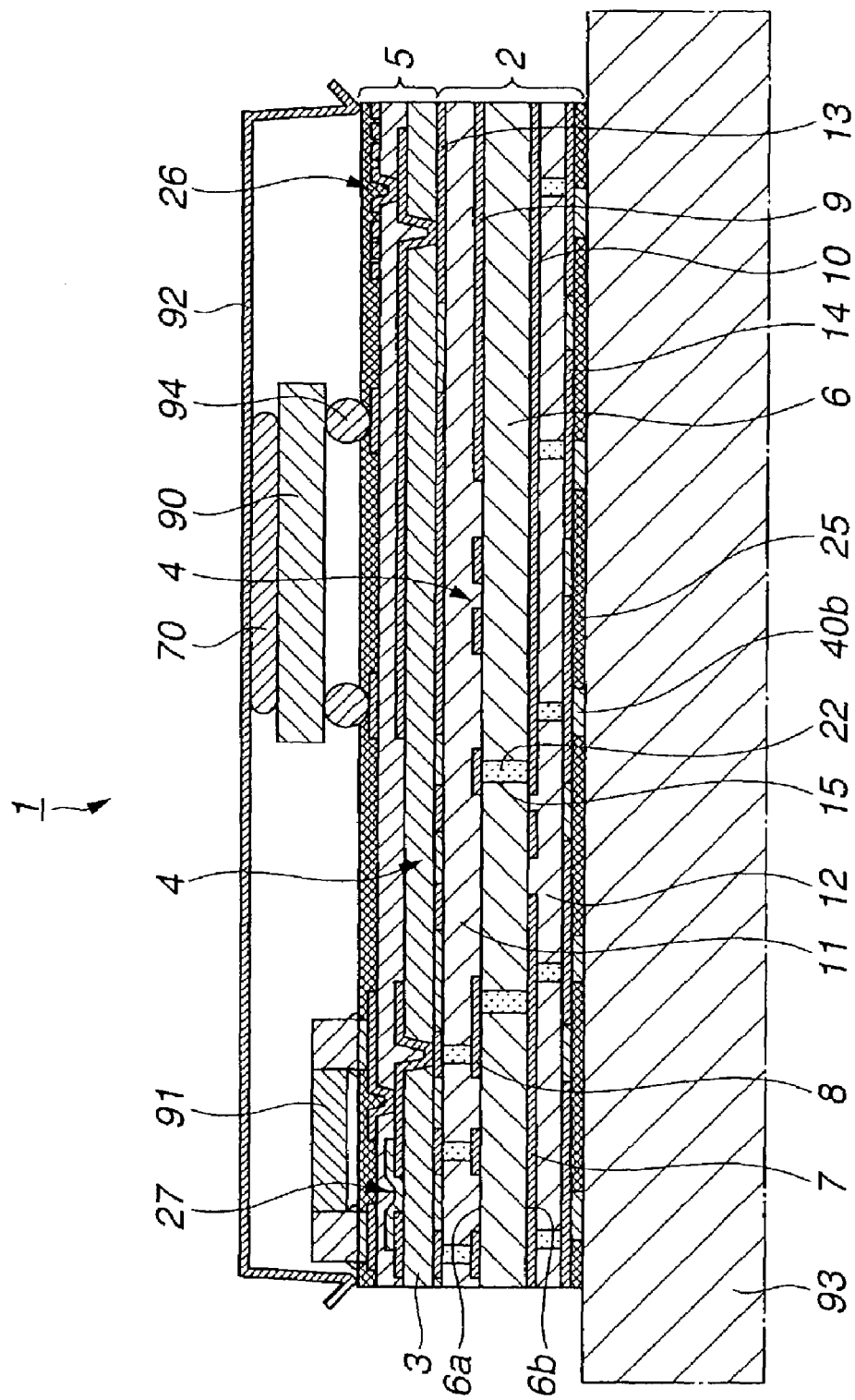
FIG. 25 is a longitudinal sectional view showing a high-frequency module device having a radiation structure.

In the high-frequency module device 1, the high-frequency IC 90 and the chip component 91 mounted on the surface of the high-frequency element layer part 5 are covered with the shield cover 92. Therefore, in the high-frequency module device 1, since heating from the high-frequency IC 90 and the chip component 91 stays within the shield cover 92, it is preferred to provide a radiation structure in which a thermally conductive resin member 70 or the like is filled between the upper surface of the high-frequency IC 90 and the inner surface of the shield cover 92, for example, as shown in FIG. 25.

In the high-frequency module device 1 thus constituted, as the distributed constant circuits 4 are formed in the first pattern wiring layer 9 and the third pattern wiring layer 13 of the base board part 2, as described above, the distributed constant circuits 4 are embedded in the base board part 2. Thus, in the high-frequency module device 1 according to the present invention, the area in the base board part 2 where the distributed constant circuits 4 are formed can be reduced.

Since the area for forming the distributed constant circuits 4 on the surface of the base board part 2 is reduced, the high-frequency module device 1 according to the present invention can be miniaturized. Moreover, in the high-frequency module device 1 according to the present invention, since the ground part of the third pattern wiring layer 13 and the ground part of the second pattern wiring layer 10 are formed above and below the filter circuit part 21, which is the distributed constant circuit 4, these ground parts serve as shields to the filter circuit part 21. Therefore, in the high-frequency module device 1, the passive elements such as the inductor part 26 and the circuit elements such as the high-frequency IC 90 formed on the high-frequency element layer forming surface 3 can be prevented from electrically interfere with the circuit filter part 21. Thus, in the high-frequency module device 1 according to the present invention, the passive elements and the circuit elements need not be distanced from the distributed constant circuits 4 such as the filter circuit part 21 at a predetermined spacing, and reduction in area and size can be realized.

In the high-frequency module device 1 according to the present invention, the distributed constant circuits 4 formed on the base board part 2 are not limited to the filter circuit part 21, the antenna circuit part 24 and the like. For example, the distributed constant circuits 4 such as a balun circuit part, a directional coupling circuit part and an impedance matching circuit part may also be formed. Also in this case, in the high-frequency module device 1, since the area for forming the distributed constant circuits 4 such as the balun circuit part, the directional coupling circuit part and the impedance matching circuit part on the surface of the base board part 2 is reduced, reduction in area can be realized. Moreover, since the passive elements and the circuit elements need not be distanced from the distributed constant circuits 4 such as the balun circuit part, the directional coupling circuit part and the impedance matching circuit part at a predetermined spacing, the high-frequency module device 1 can be miniaturized.

Figure 26:
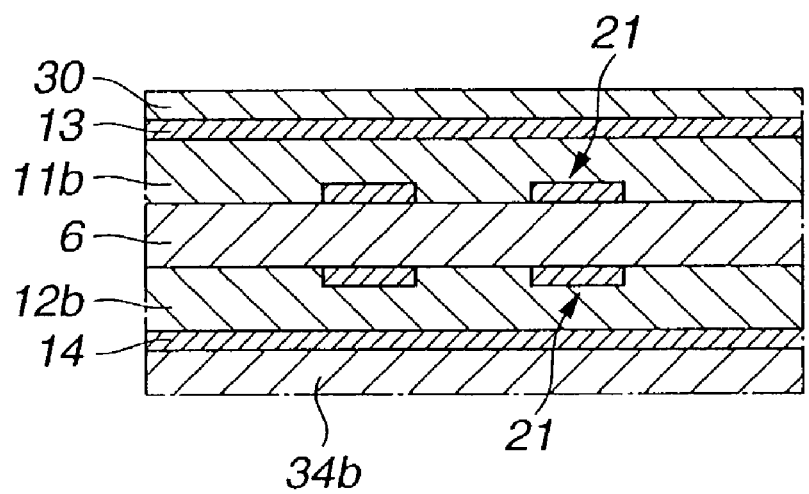
FIG. 26 is a longitudinal sectional view showing the state where a plurality of distributed constant circuits are formed in the direction of thickness.

In the high-frequency module device 1 according to the present invention, since the base board part 2 has the multilayer structure made up of the pattern wiring layers and the insulating layers, as shown in FIG. 26, the distributed constant circuits 4 such as the filter circuit part 21 can be formed in a multilayer form.

In the conventional high-frequency module device, in the case of forming a plurality of distributed constant circuits such as a filter circuit part, the distributed constant circuits can be formed only in one layer, that is, the passive element forming layer on one major surface of a Si or glass substrate, and the occupied area for forming the distributed constant circuits is increased, making it difficult to reduce the area and size.

On the other hand, in the high-frequency module device 1 to which the present invention is applied, since the distributed constant circuits 4 such as the filter circuit part 21 can be formed in a multilayer form in the base board part 2 as described above, the area for forming the distributed constant circuits 4 is reduced and significant reduction in area and size can be realized.

Figure 27:
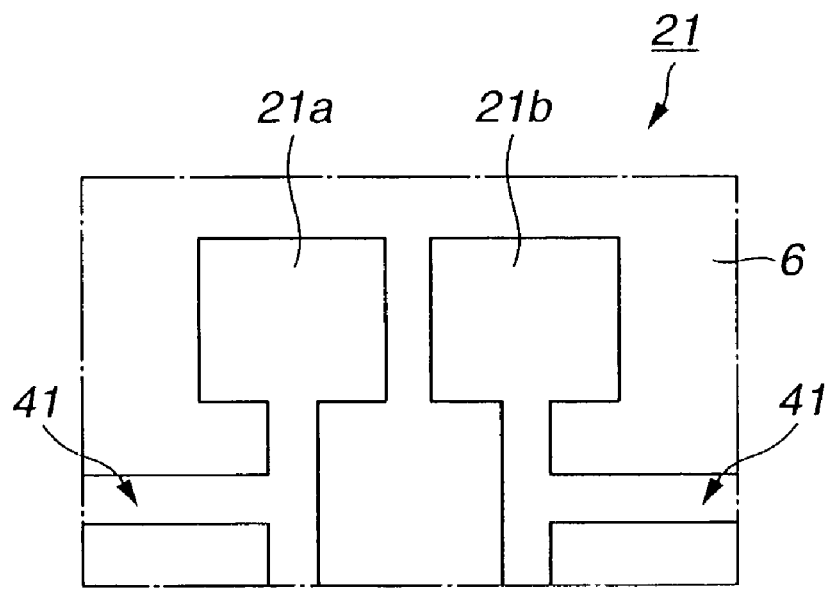
FIG. 27 is a plan view showing an exemplary wiring pattern in the distributed constant circuit.

Moreover, in the high-frequency module device 1 according to the present invention, resonator conductor patterns 21*a*, 21*b* provided along with the filter circuit part 21 are formed on the core board 6 of the base board part 2, as shown in FIG. 27. In each of the resonator conductor patterns 21*a*, 21*b*, a lead-out conductor 41 for inputting/outputting signals is formed substantially at a central part in the longitudinal direction. One end side in the longitudinal direction (referred to as short-circuit side) of each of the resonator conductor patterns 21*a*, 21*b* forms a short circuit with the third pattern wiring layer 13 and the second pattern wiring layer 10, for example, by a via-hole. The other end side (referred to as open side) of each of the resonator conductor patterns 21*a*, 21*b* has a broader pattern width. Thus, the impedance on the short-circuit side of the resonator conductor patterns 21*a*, 21*b* is increased and the impedance on the open side is reduced, thus forming the filter circuit part 21 which can acquire only a desired frequency signal.

The filter circuit part 21 having the wiring pattern as described above is embedded in the base board part 2. Therefore, the high-frequency module device 1 does not require an area for forming the filter circuit part 21 on the surface of the base board part 2 and therefore can be miniaturized.

Figure 28:
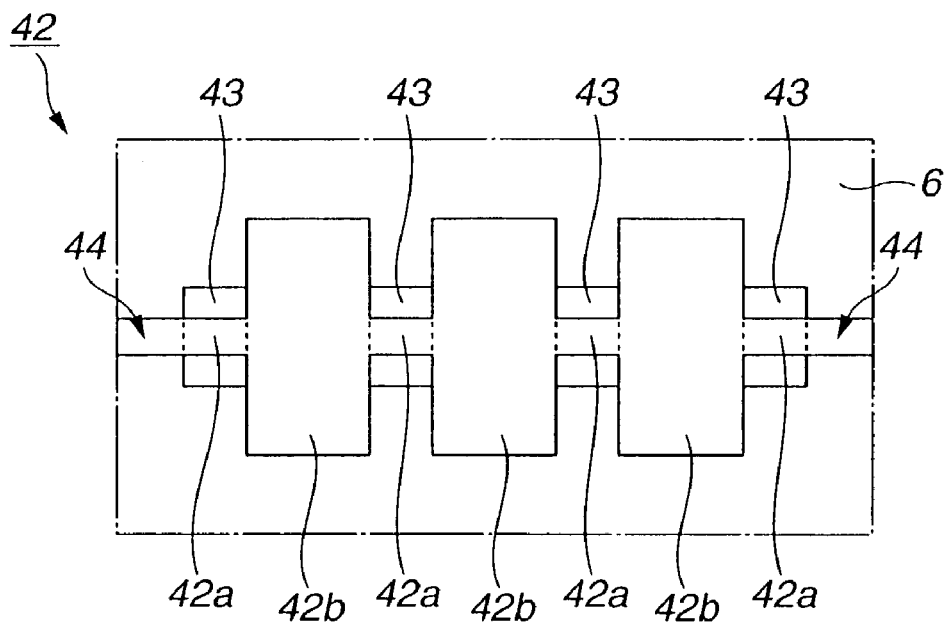
FIG. 28 is a transparent plan view showing the exemplary wiring pattern in the distributed constant circuit.
Figure 29:
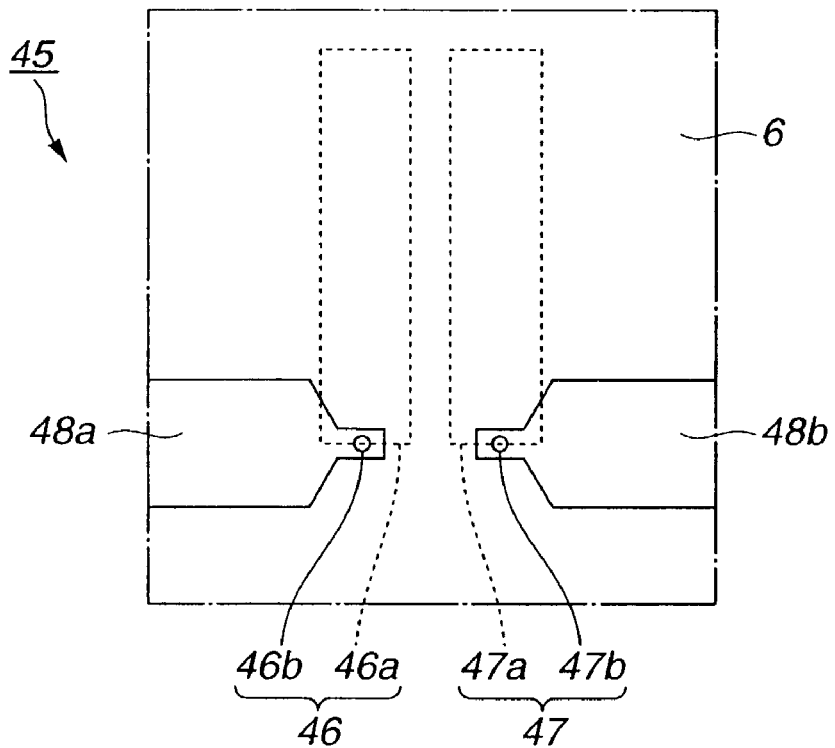
FIG. 29 is a transparent plan view showing another exemplary wiring pattern in the distributed constant circuit.
Figure 30:
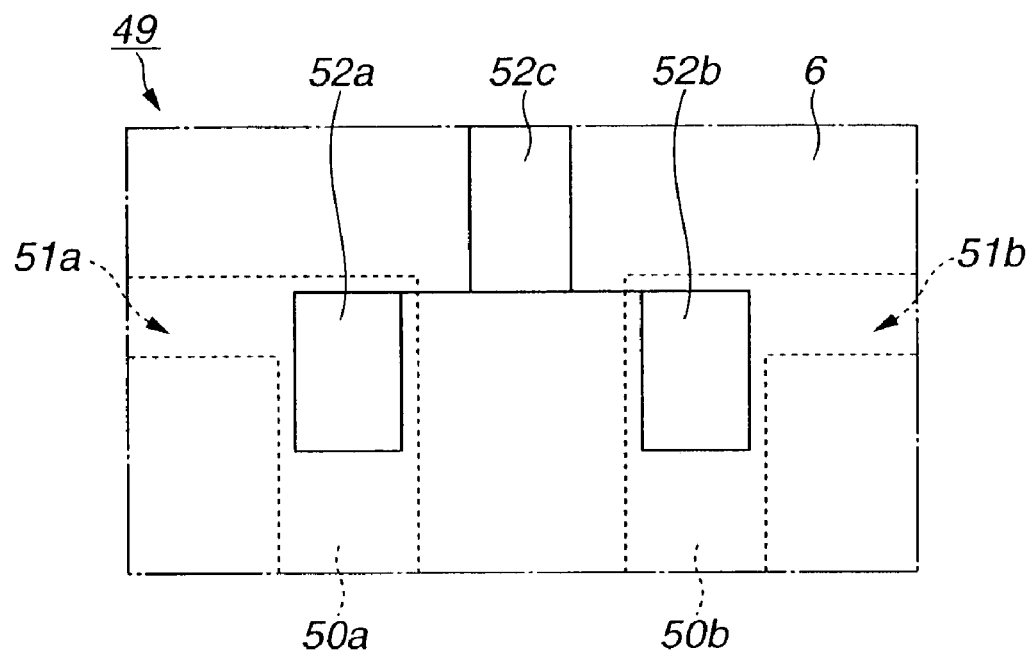
FIG. 30 is a transparent plan view showing still another exemplary wiring pattern in the distributed constant circuit.

In the high-frequency module device 1, the wiring pattern of the filter circuit 21 is not limited, and for example, filter circuit parts having wiring patterns as shown in FIGS. 28 to 30 may be provided. In the filter circuit parts having the wiring patterns shown in FIGS. 28 to 30, the structure and members equivalent to those of the aboved-described filter circuit part 21 will not be described in detail and denoted by the same numerals in the drawings.

In a filter circuit part 42 shown in FIG. 28, narrower parts 42a are deposited in a short-side direction on cavities 43 formed on the core board 6, and broader parts 42b are deposited in the one short-side direction on the core board 6. The filter circuit part 42 has such a wiring pattern that the narrower parts 42a and the broader parts 42b are formed alternately and continuously. At both ends in the longitudinal direction of the filter circuit part 42, a lead-out conductor 44 for inputting/outputting high-frequency signals is formed. In the filter circuit part 42, the narrower parts 42a function as inductance and the broader parts 42b function as capacitance. Thus, in the filter circuit part 42, as the narrower parts 42a are formed on the cavities 43, the narrower parts 42a can effectively function as inductance without being made too narrow. The loss of an inputted high-frequency signal is not increased and a desired frequency can be obtained without making the narrower parts 42a too short.

The filter circuit part 42 having the wiring pattern as described above is embedded in the base board part 2. Therefore, the high-frequency module device 1 does not require an area for forming the filter circuit part 42 on the surface of the base board part 2 and therefore can be miniaturized.

A filter circuit part 45 shown in FIG. 29 has conductor patterns 46, 47 which are formed on the resin layer 12b. The conductor pattern 46 functions as an input-side conductor and has a relatively broad low-impedance pattern 46a and a relatively narrow high-impedance pattern 46b. The conductor pattern 47 functions as an output-side conductor and has a relatively broad low-impedance pattern 47a and a relatively narrow high-impedance pattern 47b. The low-impedance patterns 46a, 47a are arranged at a predetermined spacing between each other within a layer sandwiched between the resin layer 12b and the core board 6, and their longitudinal directions are substantially parallel to each other. The high-impedance patterns 46b, 47b are formed to penetrate the resin layer 12b and the core board 6 in the direction of thickness. The high-impedance patterns 46b, 47b intersect and are electrically connected with the low-impedance patterns 46a, 47a, respectively, on the resin layer 12b.

One end side of the high-impedance pattern 46b of the conductor pattern 46 is electrically connected with the fourth pattern wiring layer 14, and its other end side is electrically connected with an input part pattern 48a which also serves as a lead-out conductor deposited on the core board 6. One end side of the high-impedance pattern 47b of the conductor pattern 47 is electrically connected with the fourth pattern wiring layer 14, and its other end side is electrically connected with an output part pattern 48b which also serves as a lead-out conductor deposited on the core board 6.

In the filter circuit part 45 thus constituted, a high-frequency signal supplied to the input part pattern 48a is filtered by the conductor patterns 46, 47 and only a desired frequency is obtained at the output part pattern 48b.

The filter circuit part 45 having the wiring pattern as described above is embedded in the base board part 2. Therefore, the high-frequency module device 1 does not require an area for forming the filter circuit part 45 on the surface of the base board part 2 and therefore can be miniaturized.

In a filter circuit part 49 shown in FIG. 30, L-shaped conductor patterns 50a, 50b are arranged on the resin layer 12b, with their one sides being substantially parallel to each other. The other sides of the conductor patterns 50a, 50b, which are not parallel to each other, function as lead-out conductors 51a, 51b for inputting/outputting high-frequency signals. The one sides of these conductor patterns 50a, 50b, which are arranged substantially parallel to each other, are electrically connected with the third pattern wiring layer 13 and the fourth pattern wiring layer 14, for example, by via-connection. In the filter circuit part 49, conductor patterns 52a, 52b, 52c are arranged in a Y-shape on the core board 6. The conductor patterns 52a, 52b are arranged to face the substantially parallel sides of the conductor patterns 50a, 50b. The conductor pattern 52c has its one end part electrically connected with the third pattern wiring layer 13 or the fourth pattern wiring layer 14, for example, by via-connection.

In the filter circuit part 49 having such a tri-plate structure, a high-frequency signal supplied from the lead-out conductor 51a is filtered by the conductor patterns 50a, 50b and the conductor patterns 52a, 52b, 52c and only a desired frequency is obtained at the lead-out conductor 51b.

The filter circuit part 49 having the wiring pattern as described above is embedded in the base board part 2. Therefore, the high-frequency module device 1 does not require an area for forming the filter circuit part 49 on the surface of the base board part 2 and therefore can be miniaturized.

Figure 31:
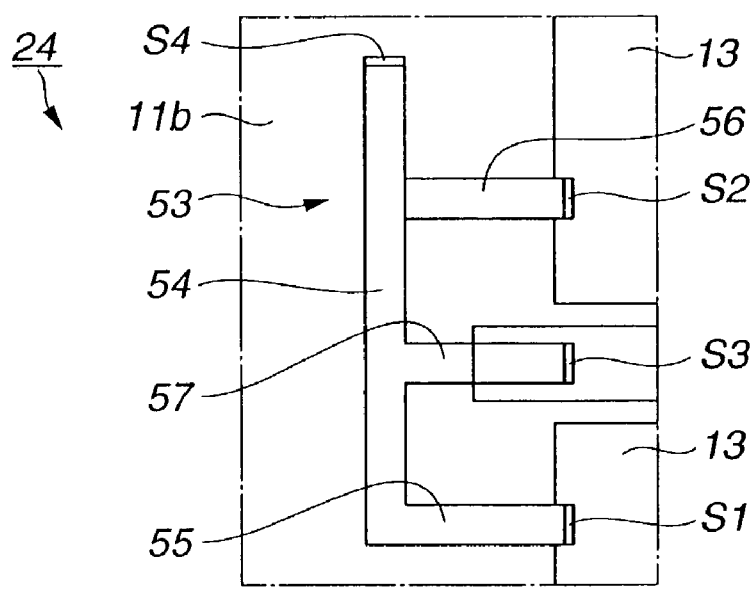
FIG. 31 is a plan view showing an exemplary wiring pattern in the distributed constant circuit.

In the high-frequency module device 1, an inverted F-shaped antenna pattern 53 is formed as the antenna circuit part 24 on the resin layer 11b of the base board part 2, as shown in FIG. 31. This antenna pattern 53 has a resonator pattern 54 having an effective length of approximately λ/4, a ground point S1 at a distal end part of a first pattern 55 bent substantially at right angles at one end part of the resonator pattern 54, a ground point S2 at a distal end part of a second pattern 56 extended from a halfway part of the resonator pattern 54 and parallel to the first pattern 55, and a feeding point S3 at a distal end part of a third pattern 57 extended from between the first pattern 55 and the second patterns 56 of the resonator pattern 54 and parallel to the first pattern 55 and the second pattern 56. In this antenna pattern 53, the other end part of the resonator pattern 54 is an open point S4.

In this antenna circuit part 24, the ground points S1, S2 of the antenna pattern 53 are flexibly grounded on the third pattern wiring layer 13 formed on the resin layer 11b, and feeding and distribution of an RF signal to the antenna circuit part 24 from the feeding point S3 of the antenna pattern 53 are carried out.

As the antenna circuit part 24 having the wiring pattern as described above is formed in the base board part 2, it is possible to arrange the distributed constant circuits 4 such as the above-described filter circuit part 21 below the antenna circuit part 24 or otherwise. Therefore, in the high-frequency module device 1, since the distributed constant circuits 4 can be formed in a multilayer form below the antenna circuit part 24 formed in the base board part 2 or otherwise, significant reduction in area and size can be realized.

In the high-frequency module device 1, the wiring pattern of the antenna circuit part 24 is not limited to the inverted F-shaped wiring pattern. Various types of antenna circuit parts which, of course, function as antennas, for example, dipole type, bow tie type, patch type, micro-trip type, monopole type, meander type and the like, can be used.

INDUSTRIAL APPLICABILITY

According to the high-frequency module device of the present invention, since the distributed constant circuits are formed in a multilayer form in the multilayer printed wiring part in the base board, reduction in area and size of the device itself can be realized. Moreover, according to the high-frequency module device of the present invention, since the distributed constant circuits are formed in the multilayer printed wiring part, the ground part for shielding the distributed constant circuits can be easily formed and electrical interference with the distributed constant circuits by the passive elements and the circuit elements can be restrained. Therefore, the present invention provides a high-frequency module device with a small size and high performance even in the case where the distributed constant circuits, the passive elements and the circuit elements are aggregated.

The invention claimed is:

1. A high-frequency module device comprising:
   a base board having a high-frequency filter element layer forming surface formed by performing flattening processing on an uppermost layer a multilayer printed wiring part in which a printed wiring layer having a ground part and a dielectric insulating layer made of a dielectric insulating material are formed in a multilayer form on one major surface of a core board; and
   a high-frequency element part disposed on top of said baseboard having a passive element and a circuit element for receiving power or a signal supplied from said base board via a dielectric insulating part made of a dielectric insulating material, on the high-frequency filter element layer forming surface of said base board;
   wherein a distributed constant circuit is disposed between layers of said base board.

2. A high-frequency module device comprising:
   a base board having a high-frequency filter element layer forming surface formed by performing flattening processing on an uppermost layer of a multilayer printed wiring part in which a printed wiring layer having a ground part and a dielectric insulating layer made of a dielectric insulating material are formed in a multilayer form on one major surface of a core board; and
   a high-frequency element part having a passive element and a circuit element for receiving power or a signal supplied from said base board via a dielectric insulating part made of a dielectric insulating material, on the high-frequency filter element layer forming surface of said base board;
   wherein a distributed constant circuit is disposed between layers of said base board, wherein said ground part is formed above and below said distributed constant circuit.

3. The high-frequency module device as claimed in claim 2, wherein said distributed constant circuit is at least one of a filter circuit, a balun circuit, a directional coupling circuit, and an impedance matching circuit part.

4. A high-frequency module device comprising:
   a base board having a high-frequency filter element layer forming surface formed by performing flattening processing on an uppermost layer of a multilayer printed wiring part in which a printed wiring layer having a ground part and a dielectric insulating layer made of a dielectric insulating material are formed in a multilayer form on one major surface of a core board; and
   a high-frequency element part having a passive element and a circuit element for receiving power or a signal supplied from said base board via a dielectric insulating part made of a dielectric insulating material, on the high-frequency filter element layer forming surface of said base board;
   wherein a distributed constant circuit is disposed between layers of said base board, wherein said distributed constant circuit is an antenna circuit part formed by a depositing technique.

5. A method for manufacturing a high-frequency module device comprising:
   a base board preparation process for preparing a base board through a first step of forming a printed wiring layer having a ground part on one major surface of a core board and forming a dielectric insulating layer on the printed wiring layer, a second step of pattern-forming a distributed constant circuit made on said dielectric insulating layer, a third step of sequentially depositing a dielectric insulating layer for covering said distributed constant circuit and a printed wiring layer formed on the dielectric insulating layer, thus forming a multilayer printed wiring part, and a fourth step of performing flattening processing on an uppermost layer of said multilayer printed wiring part, thus forming a high-frequency filter element layer forming surface; and
   a high-frequency filter element layer forming process for forming a high-frequency filter element layer through a fifth step of forming a passive element for receiving power or a signal supplied from said base board via a dielectric insulating part made of a dielectric insulating material, on the high-frequency filter element layer forming surface of said base board, and a sixth step of joining a circuit element for receiving power or a signal supplied from said base board via said dielectric insulating part.

6. The method for manufacturing a high-frequency module device as claimed in claim 5, wherein in said second step and said third step, said distributed constant circuit is formed in the state where the distributed constant circuit is sandwiched between said printed wiring layers.

* * * * *